United States Patent
Umeda et al.

(10) Patent No.: US 12,494,415 B2
(45) Date of Patent: Dec. 9, 2025

(54) TIP CONNECTION PORTION OF TERMINAL MEMBER AND ASSOCIATED SEMICONDUCTOR DEVICE

(71) Applicant: SHINDENGEN ELECTRIC MANUFACTURING CO., LTD., Tokyo (JP)

(72) Inventors: Soichiro Umeda, Saitama (JP); Atsushi Kyutoku, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 496 days.

(21) Appl. No.: 17/857,261

(22) Filed: Jul. 5, 2022

(65) Prior Publication Data
US 2023/0007986 A1  Jan. 12, 2023

(30) Foreign Application Priority Data
Jul. 12, 2021 (JP) ................. 2021-115198

(51) Int. Cl.
*H01L 23/495* (2006.01)
*H01L 23/31* (2006.01)
*H01L 23/492* (2006.01)
*H01L 23/00* (2006.01)

(52) U.S. Cl.
CPC .... *H01L 23/49517* (2013.01); *H01L 23/3107* (2013.01); *H01L 23/4924* (2013.01); *H01L 24/29* (2013.01); *H01L 2224/291* (2013.01); *H01L 2224/2929* (2013.01); *H01L 2224/29339* (2013.01); *H01L 2924/014* (2013.01)

(58) Field of Classification Search
CPC ................................ H01L 23/49517
USPC ........................................ 257/397
See application file for complete search history.

(56) References Cited

U.S. PATENT DOCUMENTS

| | | | | |
|---|---|---|---|---|
| 4,673,967 A | * | 6/1987 | Hingorany | H01L 23/49534 257/E23.041 |
| 4,724,473 A | * | 2/1988 | Lacruche | H01L 23/3107 257/E23.048 |
| 9,202,798 B2 | | 12/2015 | Yoo et al. | |
| 11,139,278 B2 | * | 10/2021 | Niu | H01L 23/427 |
| 2005/0280490 A1 | | 12/2005 | Uchiyama et al. | |
| 2007/0215999 A1 | | 9/2007 | Kashimoto et al. | |
| 2008/0217756 A1 | | 9/2008 | Boettcher et al. | |
| 2013/0250535 A1 | | 9/2013 | Takamiya et al. | |

(Continued)

FOREIGN PATENT DOCUMENTS

| CN | 111316429 | 6/2020 |
|---|---|---|
| DE | 102005024900 | 1/2006 |

(Continued)

OTHER PUBLICATIONS

Official Action Dated Dec. 30, 2024 From the US Patent and Trademark Office Re. U.S. Appl. No. 17/857,242. (15 Pages).

(Continued)

*Primary Examiner* — Ajay Arora

(57) ABSTRACT

A terminal member connected to a connection target portion includes: a bent portion bent toward the connection target portion; and a tip connection portion provided at a tip part (Continued)

of the bent portion, in which the tip connection portion is connected to the connection target portion via a conductive bonding material.

4 Claims, 30 Drawing Sheets

(56) References Cited

U.S. PATENT DOCUMENTS

| | | |
|---|---|---|
| 2014/0003013 A1 | 1/2014 | Yoo et al. |
| 2014/0198509 A1 | 7/2014 | Takiguchi et al. |
| 2015/0201532 A1 | 7/2015 | Soyano |
| 2017/0294374 A1 | 10/2017 | Simakawa et al. |
| 2017/0309555 A1 | 10/2017 | Shimakawa et al. |
| 2017/0309556 A1 | 10/2017 | Shimakawa et al. |
| 2019/0143434 A1 | 5/2019 | Yoneda et al. |
| 2020/0058600 A1 | 2/2020 | Murakami et al. |
| 2020/0350236 A1 | 11/2020 | Umeda et al. |
| 2020/0395276 A1 | 12/2020 | Umeda et al. |
| 2021/0233885 A1 | 7/2021 | Umeda et al. |
| 2022/0301986 A1* | 9/2022 | Yamaguchi ....... H01L 23/49544 |
| 2023/0009548 A1 | 1/2023 | Umeda et al. |
| 2023/0011041 A1 | 1/2023 | Umeda et al. |
| 2023/0011627 A1 | 1/2023 | Umeda et al. |

FOREIGN PATENT DOCUMENTS

| | | |
|---|---|---|
| DE | 102004057421 | 6/2006 |
| DE | 102007010883 | 9/2008 |
| DE | 102008033410 | 6/2011 |
| DE | 102017103110 | 10/2017 |
| JP | 02-037757 | 2/1990 |
| JP | 03-214573 | 9/1991 |
| JP | 2004-106468 | 4/2004 |
| JP | 3610749 | 1/2005 |
| JP | 2012-043956 | 3/2012 |
| JP | 2013-239501 | 11/2013 |
| JP | 6316504 | 4/2018 |
| JP | 6465170 | 2/2019 |
| JP | 6636978 | 1/2020 |
| JP | 2020-113582 | 7/2020 |
| JP | 6719585 | 7/2020 |
| JP | 6850938 | 3/2021 |
| WO | WO 2017/195625 | 11/2017 |

OTHER PUBLICATIONS

Bauchau et al. "Structural analysis: with applications to aerospace structures", Chapter 16: Kirchhoff plate theory, p. 865-872, 2009.
Callegaro et al. "Bus Bar Design for High-Power Inverters", IEEE Transactions on Power Electronics, 33(3): 2354-2367, Mar. 2018.
Notice of Reasons for Refusal Dated Mar. 11, 2025 From the Japan Patent Office Re. Application No. 2021-115198 and Its Translation Into English. (6 Pages).
Notice of Reasons for Refusal Dated Mar. 11, 2025 From the Japan Patent Office Re. Application No. 2021-115199 and Its Translation Into English. (5 Pages).
Notice of Reasons for Refusal Dated Mar. 11, 2025 From the Japan Patent Office Re. Application No. 2021-115201 and Its Translation Into English. (5 Pages).
Official Action Dated May 9, 2025 From the US Patent and Trademark Office Re. U.S. Appl. No. 17/857,266. (15 Pages).
Official Action Dated Jun. 18, 2025 from the US Patent and Trademark Office Re. U.S. Appl. No. 17/851,227. (20 Pages).
Official Action Dated Jun. 18, 2025 from the US Patent and Trademark Office Re. U.S. Appl. No. 17/857,227. (20 Pages).
Prüfungsantrag [Application for Examination] Datecl Jun. 5, 2025 From the Deutsches Patent- und Markenamt [German Patent and Trademark Office] Re. Application No. 102022116908.1 and Its Translation Into English. (8 Pages).
Prüfungsantrag [Application for Examination] Dated Jun. 5, 2025 From the Deutsches Patent- und Markenamt [German Patent and Trademark Office] Re. Application No. 102022116910.3 and Its Translation Into English. (8 Pages).
Prüfungsantrag [Application for Examination] Dated Jun. 5, 2025 From the Deutsches Patent- und Markenamt [German Patent and Trademark Office] Re. Application No. 102022116911.1 and Its Translation Into English. (9 Pages).
Prüfungsantrag [Application for Examination] Dated Jun. 5, 2025 From the Deutsches Patent- und Markenamt [German Patent and Trademark Office] Re. Application No. 102022116914.6 and Its Translation Into English. (9 Pages).

* cited by examiner

FIG.7
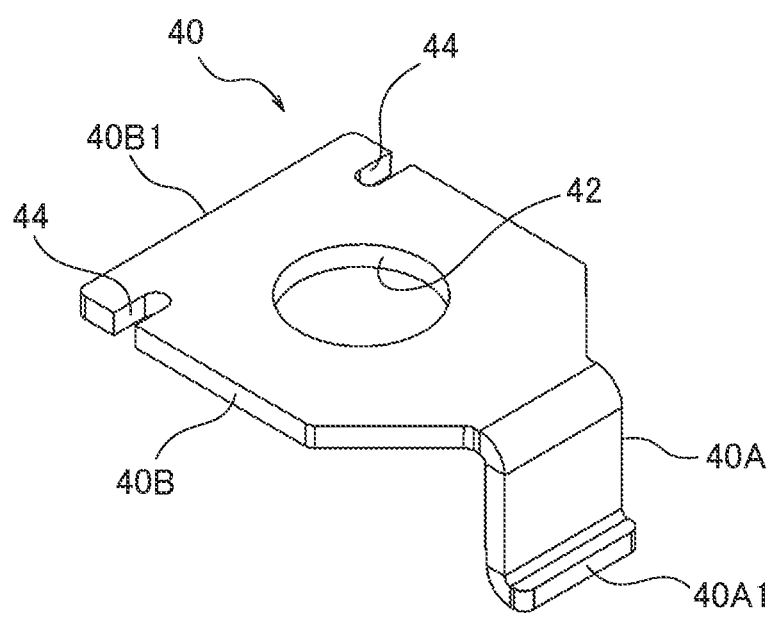
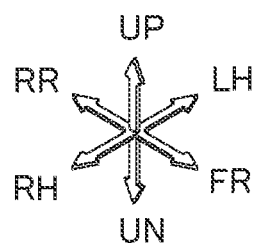

TIP CONNECTION PORTION OF TERMINAL MEMBER AND ASSOCIATED SEMICONDUCTOR DEVICE

CROSS-REFERENCE TO RELATED APPLICATION

This application is based on and claims priority under 35 USC 119 from Japanese Patent Application No. 2021-115198 filed on Jul. 12, 2021, the disclosure of which is incorporated by reference herein.

BACKGROUND

Technical Field

The present disclosure relates to a terminal member and a semiconductor device.

Related Art

The semiconductor device disclosed in Japanese Patent No. 6850938 includes a substrate on which a semiconductor chip is mounted, pin terminals connected to a wiring pattern on the substrate, and a lead frame that supports the pin terminals and electrically connects electrodes of the semiconductor chip to the pin terminals.

SUMMARY

In the conventional art described above, a bend portion is formed on a terminal portion constituted by a part of the lead frame, and the bend portion is bonded to the wiring pattern on the substrate by using a conductive bonding material such as solder. In such a configuration, when the plate thickness of the lead frame is thick, the bending radius of the bend portion is accordingly large. There is a problem that, because the size of the bending radius affects the shape of a solder fillet, the strength of bonding the terminal portion to the wiring pattern (connection target portion) is not stable. In addition, there is a problem that, when the plate thickness and the bending radius are large, the occupied area of the terminal portion is accordingly large, thereby leading to an increase in the size of the product.

In consideration of the above problem, an object of the present disclosure is to obtain a terminal member capable of stabilizing the strength of bonding to a connection target portion and preventing the occupied area of the terminal member from increasing, and to obtain a semiconductor device including the terminal member.

A terminal member according to a first aspect of the present disclosure is a terminal member connected to a connection target portion, and the terminal member includes: a bent portion bent toward the connection target portion; and a tip connection portion provided at a tip part of the bent portion, in which the tip connection portion is connected to the connection target portion via a conductive bonding material.

A semiconductor device according to the present disclosure includes: an insulating substrate; a semiconductor element disposed on a conductor portion formed on the insulating substrate; the terminal member in which the tip connection portion is connected to the conductor portion serving as the connection target portion; and a sealing resin that seals the insulating substrate and the semiconductor element.

According to the present disclosure, a terminal member connected to a connection target portion includes: a bent portion bent toward the connection target portion; and a tip connection portion provided at a tip part of the bent portion. The tip connection portion is connected to the connection target portion via a conductive bonding material. Because the shape of the tip connection portion is formed, for example, when a flat plate material for constituting the terminal member is punched by press working, the shape of the tip connection portion can be made stable regardless of the plate thickness of the flat plate material and the bending radius of the bent portion. As a result, it is possible to stabilize the strength of bonding the tip connection portion to the connection target portion via a conductive bonding material. Since the tip connection portion provided at the tip part of the bent portion is bonded to the connection target portion, the area required for bonding can be made constant regardless of the plate thickness of the flat plate material and the bending radius of the bent portion. As a result, it is possible to prevent the occupied area of the terminal member from increasing.

BRIEF DESCRIPTION OF THE DRAWINGS

Exemplary embodiments of the present disclosure will be described in detail based on the following figures, wherein:

FIG. 7 is a perspective view illustrating a second terminal;

DETAILED DESCRIPTION

Figure 1:
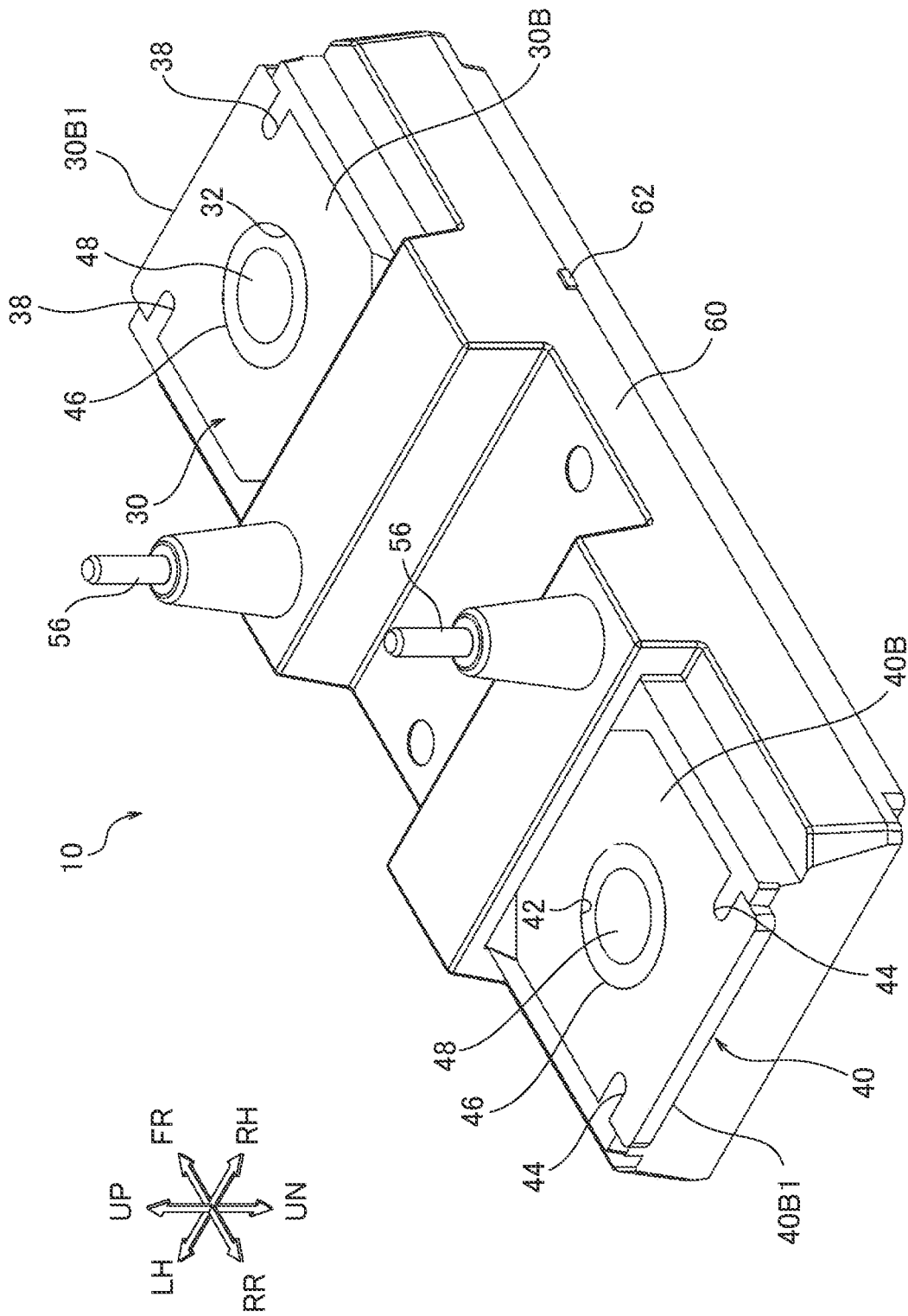
FIG. 1 is a perspective view illustrating a semiconductor device according to an embodiment.

Hereinafter, a semiconductor device 10 according to one embodiment of the present disclosure will be described with reference to FIGS. 1 to 30. In the embodiment, for convenience of description, positions, orientations, and the like of the constituent elements will be described while defining the directions indicated by FR, RR, LH, RH, UP, and UN described as appropriate in the drawings as the forward direction, the backward direction, the left direction, the right direction, the upward direction, and the downward direction. In the drawings, some reference signs may be omitted to make the drawings easy to see.

As illustrated in FIG. 1, the semiconductor device 10 according to the embodiment has a substantially rectangular parallelepiped shape that is longer in the front-rear direction and is flat in the vertical direction. As illustrated in FIGS. 1 to 5, the semiconductor device 10 includes: an insulating substrate 12; a first conductor portion 14, a second conductor portion 16, and a third conductor portion 18 that are formed on the insulating substrate 12; a semiconductor element 20 disposed on the first conductor portion 14; a first terminal 30 having a flat plate shape and connected to a source electrode (first electrode) 22 of the semiconductor element 20; a second terminal 40 having a flat plate shape and connected to the first conductor portion 14; a connection member 50 that electrically connects a gate electrode (control electrode) 24 of the semiconductor element 20 and the second conductor portion 16; two support members 52 having a flat plate shape each disposed at a predetermined distance from one of the second conductor portion 16 or the third conductor portion 18; two pin terminals 56 having a rod shape each of which is connected to one of the second conductor portion 16 or the third conductor portion 18 and is supported in a state of being inserted through the one of the two support members 52; and a sealing resin 60 that seals the insulating substrate 12, the first conductor portion 14, the second conductor portion 16, the third conductor portion 18, the semiconductor element 20, the connection member 50, and the two support members 52.

The insulating substrate 12 is a ceramic substrate of a direct copper bonding substrate (DCB) on whose lower surface (rear surface) a metal plate for heat dissipation is provided. The insulating substrate 12 may be a printed circuit board or the like. The insulating substrate 12 is formed in a rectangular flat plate shape, and is disposed at a central part in the front-rear direction of the semiconductor device 10 with the vertical direction of the semiconductor device 10 aligned in the plate thickness direction of the insulating substrate 12. The first conductor portion 14, the second conductor portion 16, and the third conductor portion 18 are formed on the upper surface (front surface) of the insulating substrate 12, as conductor patterns (copper patterns in this case). The first conductor portion 14 is formed at a central part of the insulating substrate 12, and the second conductor portion 16 and the third conductor portion 18 are formed on right and left edge portions of the insulating substrate 12. The first conductor portion 14, the second conductor portion 16, and the third conductor portion 18 are insulated from each other.

Figure 4:
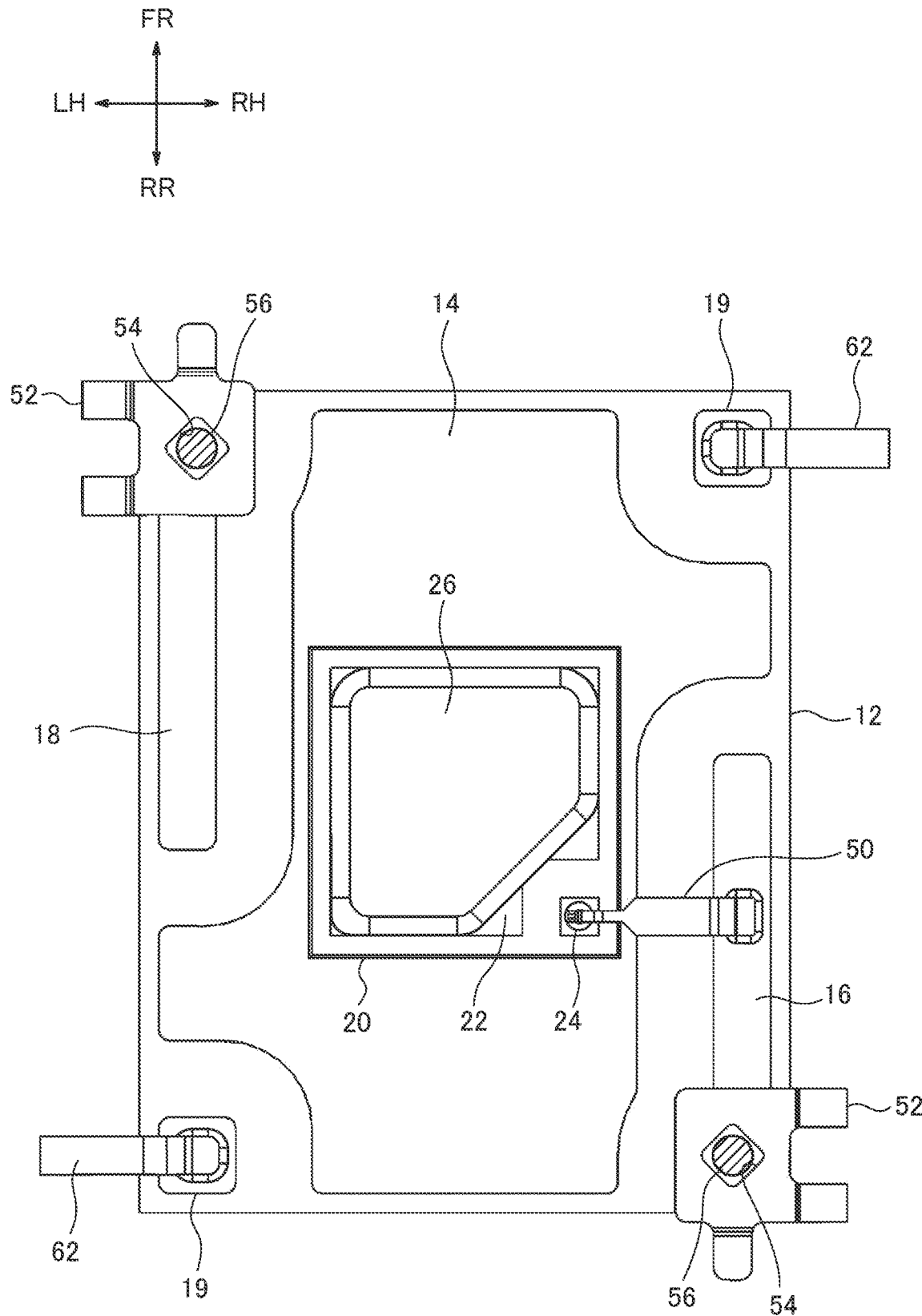
FIG. 4 is a plan view illustrating a configuration of an insulating substrate and peripheral members thereof.
Figure 5:
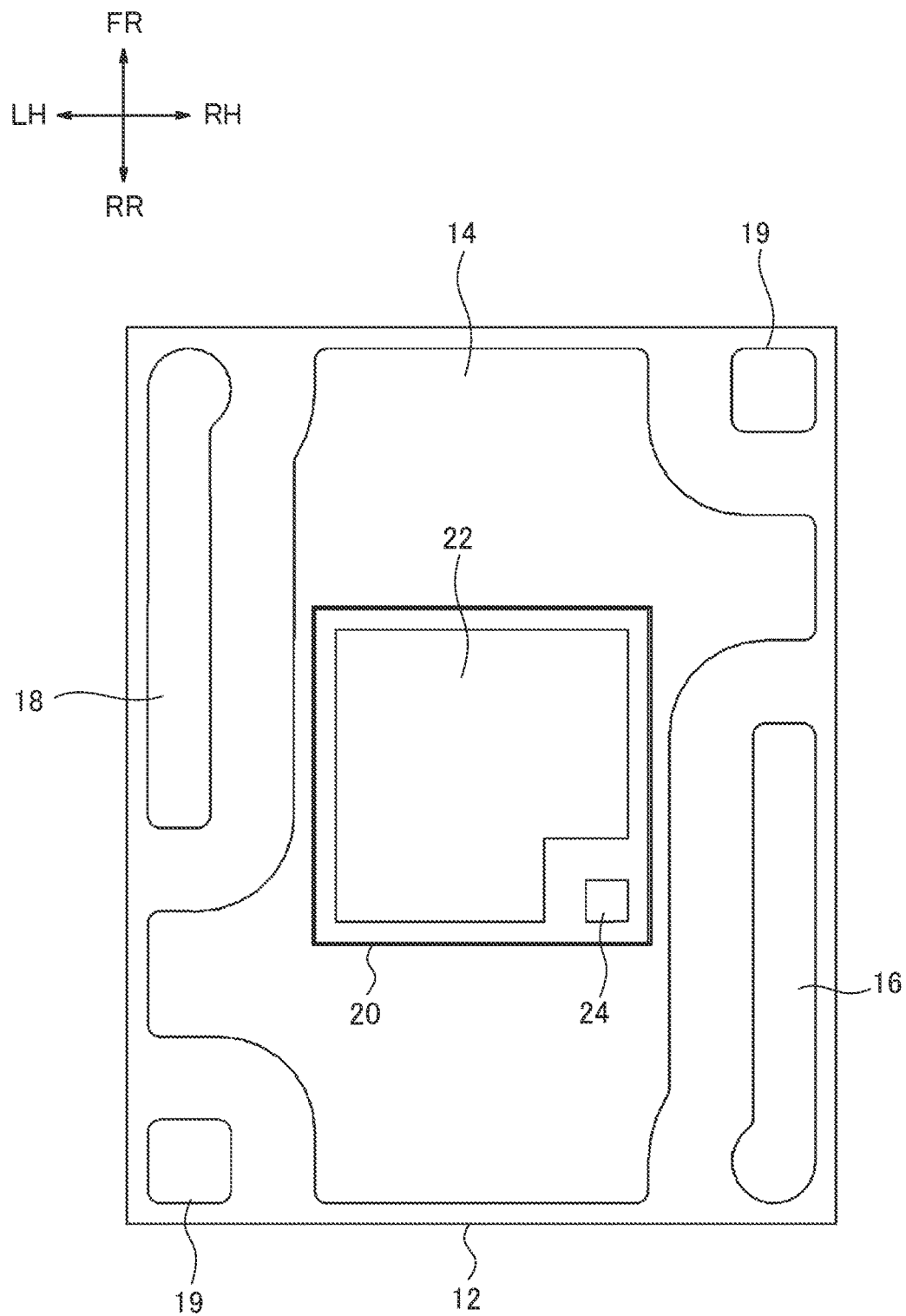
FIG. 5 is a plan view illustrating the insulating substrate.

As illustrated in FIGS. 4 and 5, the semiconductor element 20 is disposed on the first conductor portion 14. The semiconductor element 20 is a power metal-oxide-semiconductor field-effect transistor (power MOSFET). The semiconductor element 20 includes the following electrodes: a drain electrode (not illustrated) that is a second electrode formed on one surface (the lower surface, which is the surface on the insulating substrate 12 side); a source electrode 22 that is the first electrode formed on the other surface (the upper surface, which is the surface on the opposite side with respect to the insulating substrate 12); and a gate electrode 24 that is the control electrode.

The drain electrode of the semiconductor element 20 is bonded to the first conductor portion 14 via a conductive bonding material. Above the source electrode 22 of the semiconductor element 20, a conductor plate 26 (see FIG. 4) constituted by a conductive flat plate material (copper plate in this case) is disposed. The conductor plate 26 is bonded to the source electrode 22 via a conductive bonding material. In the embodiment, solder is used as the conductive bonding material. The solder may be lead-free solder. The conductive bonding material is not limited to solder, and may be an alloy or a metal having conductivity and adhesiveness, or a conductive adhesive containing silver paste or silver nanoparticles.

As illustrated in FIGS. 1 to 3 and 6, the first terminal 30 is configured in a flat plate shape and is disposed in a front part of the semiconductor device 10. The first terminal 30 corresponds to a "terminal member". The first terminal 30 is manufactured by press-molding a conductive flat plate material (copper plate in this case). The first terminal 30 integrally includes an inner terminal portion 30A to be disposed inside the sealing resin 60 (see FIG. 1) and an outer terminal portion 30B to be disposed in a state of being exposed to the outside of the sealing resin 60.

The outer terminal portion 30B has a substantially rectangular flat plate shape whose plate thickness direction is aligned with the vertical direction of the semiconductor device 10. The inner terminal portion 30A has a hanging portion 30A1 extending toward the lower side from the rear end of the outer terminal portion 30B and a bonding portion 30A2 extending toward the rear side from a rear end part of the hanging portion 30A1. The bonding portion 30A2 is disposed above the conductor plate 26 and is bonded to the conductor plate 26 via solder, which is a conductive bonding material. As a result, the first terminal 30 is electrically connected to the source electrode 22 via the conductor plate 26 and the solder.

As illustrated in FIGS. 1 to 3 and 7, the second terminal 40 is configured in a flat plate shape and is disposed in a rear part of the semiconductor device 10. The second terminal 40 is manufactured by press-molding a conductive flat plate material (copper plate in this case). The second terminal 40 integrally includes an inner terminal portion 40A to be disposed inside the sealing resin 60 (see FIG. 1) and an outer terminal portion 40B to be disposed in the state of being exposed to the outside of the sealing resin 60.

The outer terminal portion 40B has a substantially rectangular flat plate shape whose plate thickness direction is aligned with the vertical direction of the semiconductor device 10. The inner terminal portion 40A extends toward the lower side from a front end part of the outer terminal portion 40B. At a lower end part of the inner terminal portion 40A, there is formed a bonding portion 40A1 bent toward the front side. The bonding portion 40A1 is bonded to the rear end part side of the first conductor portion 14 on the insulating substrate 12 via a conductive bonding material. As a result, the second terminal 40 is electrically connected to the drain electrode of the semiconductor element 20 via the conductive bonding material and the first conductor portion 14.

At a central part of the outer terminal portion 30B of the first terminal 30 and a central part of the outer terminal portion 40B of the second terminal 40, there are respectively formed circular insertion holes 36 and 42 penetrating the outer terminal portions 30B and 40B in the plate thickness direction of the outer terminal portions 30B and 40B. In each of the insertion holes 36 and 42, a female threaded member 46 is inserted and fixed (see FIGS. 8 and 9). Each female threaded member 46 is a female threaded cap nut and has a bottomed cylindrical shape opened toward the upper side. In the inner periphery of the female threaded member 46, a female thread portion 48 is formed.

Into each of the insertion holes 36 and 42 of the outer terminal portions 30B and 40B, the end portion (one end portion), on the opening side, of one of the female threaded members 46 is inserted (press-fitted in this case). A brim-shaped flange portion 46A is formed on the outer peripheral surface, on the opening side, of each of the female threaded members 46, and the flange portions 46A are brought into contact with the lower surfaces of the outer terminal portions 30B and 40B. The other end sides of the female threaded members 46 are sealed in the sealing resin 60. One end portions of the female threaded members 46 do not need to be press-fitted into the insertion holes 36 and 42 to be fixed to the first terminal 30 and the second terminal 40. Alternatively, adhesion or the like may be used to fix the one end portions of the female threaded members 46 to the first terminal 30 and the second terminal 40. The female threaded members 46 do not need to be fixed to the first terminal 30 and the second terminal 40. Specifically, the following configuration may be used. The outer terminal portions 30B and 40B may be subjected to burring to form a cylindrical rising portion, and the female thread portion 48 may be formed in the inner periphery of each of the rising portions.

By the female threaded members 46 being fixed to the first terminal 30 and the second terminal 40, a female thread portion is provided in each of the first terminal 30 and the second terminal 40. As a result, solderless terminals, bus bars, or the like attached to external wiring can be connected to the first terminal 30 and the second terminal 40 by screw clamping.

As illustrated in FIG. 1, a front end part of the outer terminal portion 30B of the first terminal 30 is a protrusion 30B1 protruding toward the front side from a front end part of the sealing resin 60. A rear end part of the outer terminal portion 40B of the second terminal 40 is a protrusion 40B1 protruding toward the rear side from a rear end part of the sealing resin 60. By using the protrusions 30B1 and 40B1, the upper surfaces (the surfaces on which the female thread portions are provided) of the outer terminal portions 30B and 40B are brought into contact with a molding die (upper die) for molding the sealing resin 60, and the protrusions 30B1 and 40B1 are pressed from the opposite surfaces by a molding die (lower die) so that the protrusions 30B1 and 40B1 are brought into close contact with the upper die. As a result, the upper surfaces (the surfaces on which the female thread portions are provided) of the outer terminal portions 30B and 40B can be formed as exposed surfaces.

On both the left and right sides on the front end part side of the outer terminal portion 30B and on both the left and right sides on the rear end part side of the outer terminal portion 40B, there are respectively formed cutout portions 38 and 44 whose outer sides in the left-right direction are opened. The cutout portions 38 and 44 function to position the first terminal 30 and the second terminal 40. The sealing resin 60 enters the cutout portions 38 and 44. This configuration improves the strength against a load applied when screw clamping is performed with respect to the first terminal 30 and the second terminal 40. Instead of the cutout portions 38 and 44, through-holes may be formed.

Figure 6:
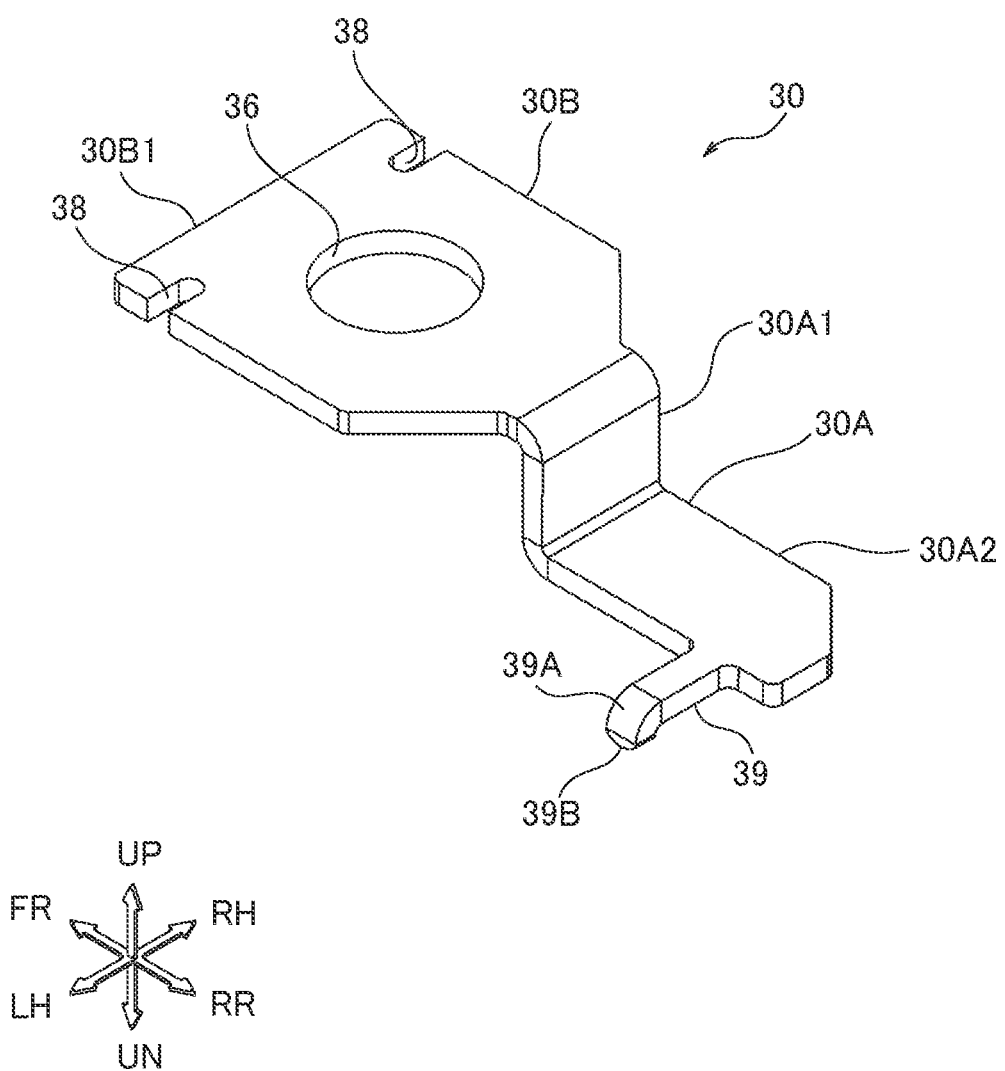
FIG. 6 is a perspective view illustrating a first terminal.
Figure 8:
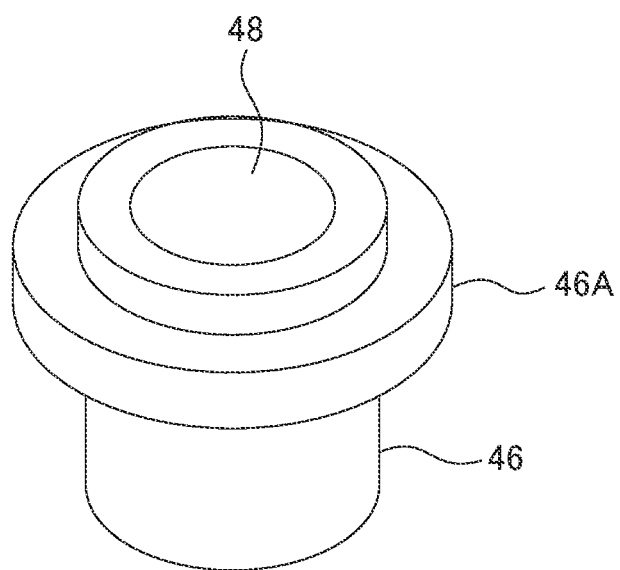
FIG. 8 is a perspective view illustrating a female threaded member.
Figure 9:
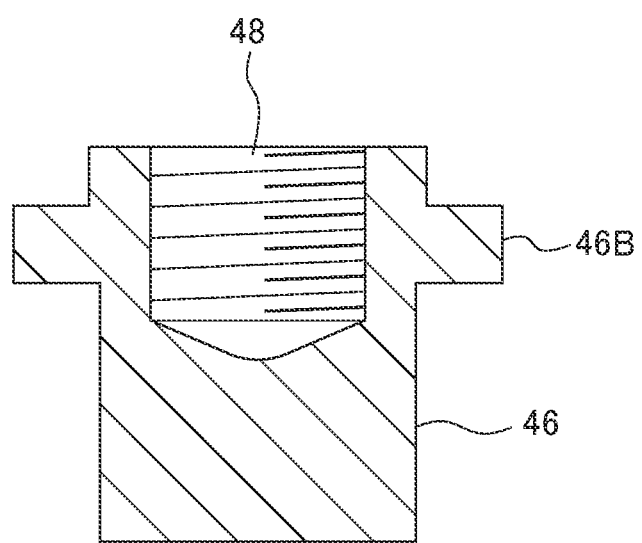
FIG. 9 is a cross-sectional view illustrating the female threaded member.
Figure 10:
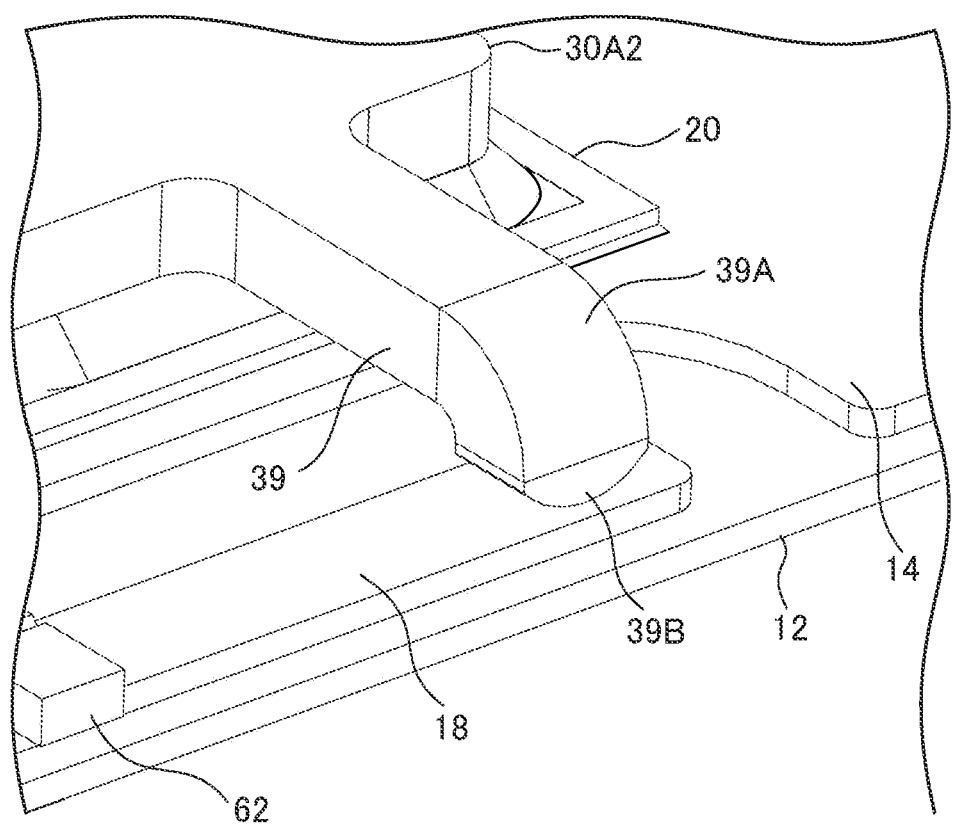
FIG. 10 is a perspective view illustrating a configuration of a bent portion and a tip connection portion of the first terminal and peripheral members of the first terminal.
Figure 11:
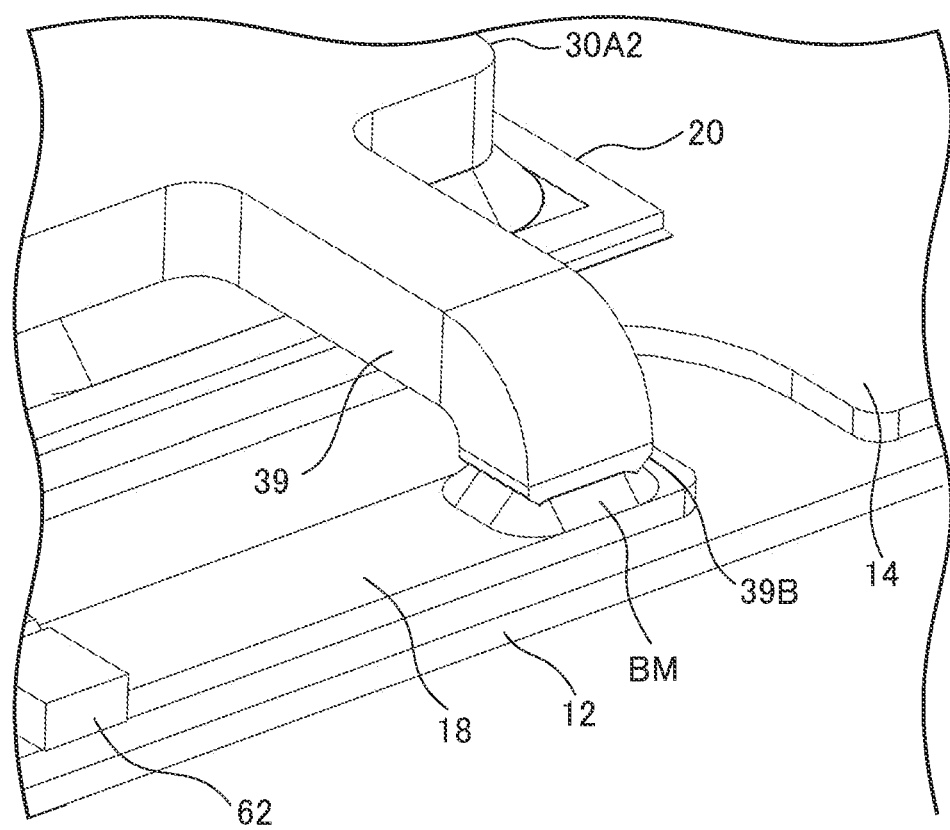
FIG. 11 is a perspective view corresponding to FIG. 10 and illustrates a state in which the tip connection portion and a third conductor portion on the insulating substrate are bonded to each other with a conductive bonding material.
Figure 12:
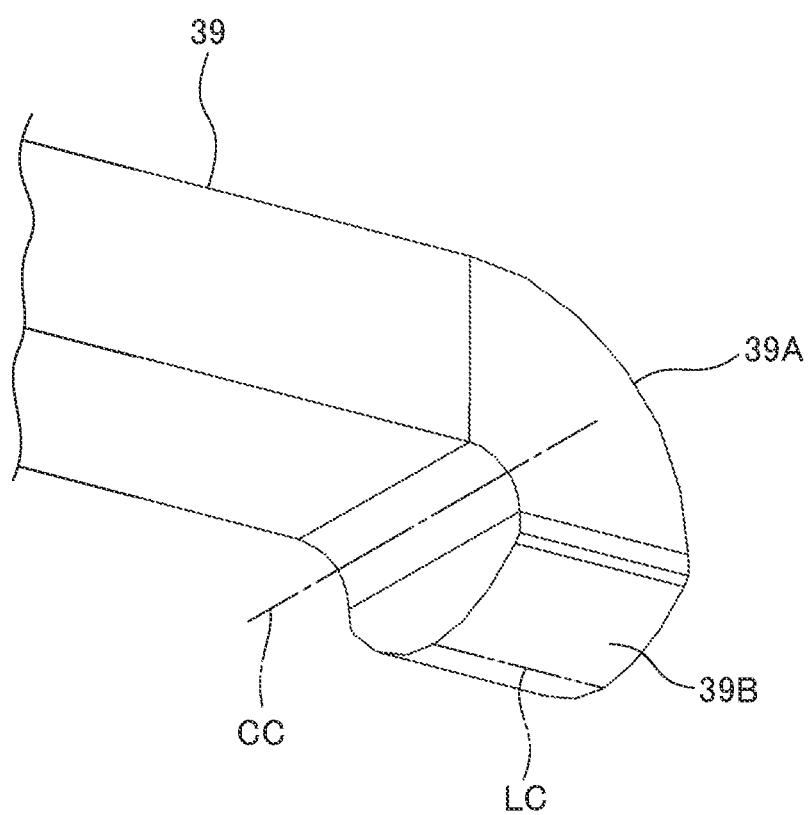
FIG. 12 is a perspective view illustrating a bent portion and a tip connection portion of the first terminal.

As illustrated in FIGS. 6, 10, and 11, a grounding extension portion 39 extends toward the left side from the left end part on the rear end part side of the inner terminal portion 30A of the first terminal 30. The tip side of the grounding extension portion 39 is disposed above the third conductor portion 18. On the tip side of the grounding extension portion 39, there is formed a bent portion 39A that is bent toward the third conductor portion 18 side (that is, the insulating substrate 12 side, in other words, the lower side). The bent portion 39A is bent with a curvature center line CC (see FIG. 12) along the front-rear direction as the bending center.

At the tip (lower end) of the bent portion 39A, there is provided a tip connection portion 39B to be connected to the third conductor portion 18. The tip connection portion 39B is formed in an arc shape protruding toward the lower side when viewed in the left-right direction, and has a lower surface formed in a curved surface shape. The curved surface of the tip connection portion 39B is in linear contact with the third conductor portion 18, which is a connection target portion. As illustrated in FIG. 11, the tip connection portion 39B is bonded to the third conductor portion 18 with a solder BM that is a conductive bonding material. In the first terminal 30 of this configuration, the curved surface shape of the tip connection portion 39B is formed when a flat plate material for constituting the first terminal 30 is punched out by press working. Then, the bent portion 39A is formed by subsequent bending work.

A location, on the tip connection portion 39B, in linear contact with the third conductor portion 18 (see the dashed-two dotted line LC in FIG. 12) extends in a direction orthogonal to the curvature center line CC. The tip connection portion 39B does not need to be in linear contact with the connection target portion, and the tip connection portion 39B may be in point contact or in area contact. The tip connection portion 39B does not need to be in direct contact with the third conductor portion 18 (connection target portion), and the tip connection portion 39B and the connection target portion are connected via a conductive bonding material that is provided between the tip connection portion 39B and the connection target portion. The connection target portion is not limited to the conductor portion on the insulating substrate 12, and may be an electrode of the semiconductor element or the like.

Figure 13:
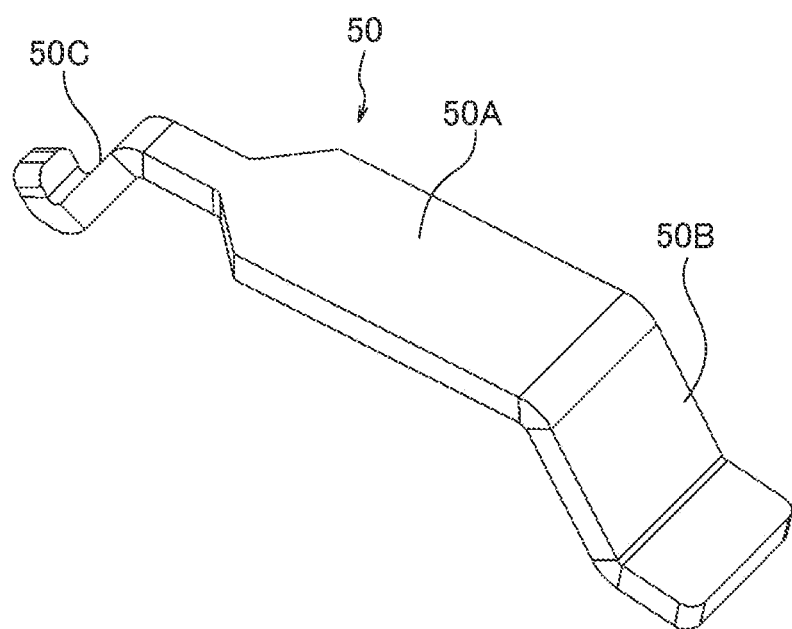
FIG. 13 is a perspective view illustrating a connection member.
Figure 14:
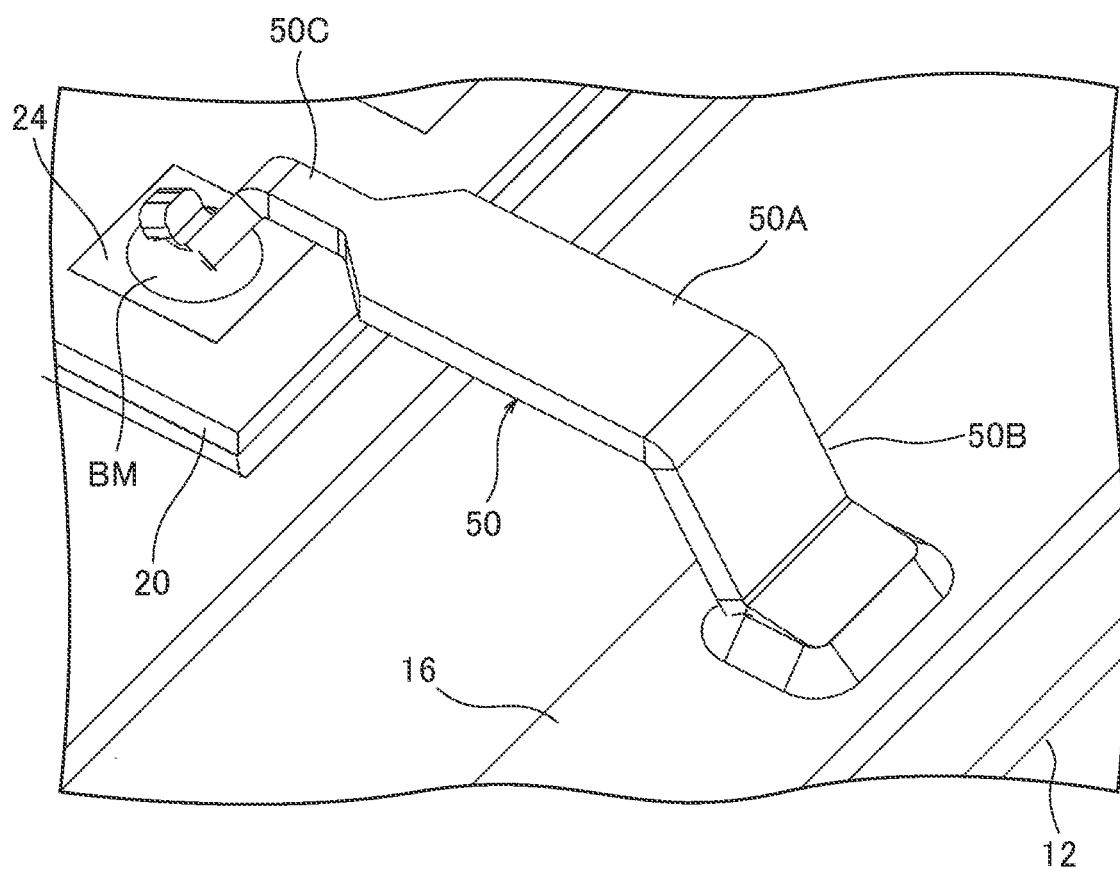
FIG. 14 is a perspective view illustrating a configuration of a connection member and peripheral members of the connection member.

As illustrated in FIG. 4, on the insulating substrate 12 there is disposed the connection member 50. The connection member 50 electrically connects the gate electrode 24 of the semiconductor element 20 to the second conductor portion 16. As illustrated in FIGS. 13 and 14, the connection member 50 is manufactured by press-molding a conductive flat plate material (copper plate in this case), and is formed in an elongated shape. The flat plate material constituting the connection member 50 is set to have a plate thickness thinner than that of the flat plate material constituting the first terminal 30 and the second terminal 40.

The central part of the connection member 50 in the longitudinal direction of the connection member 50 is a long plate-shaped horizontal portion 50A extending parallel to the insulating substrate 12. From one end part of the horizontal portion 50A in the longitudinal direction of the horizontal portion 50A, a conductor connection portion 50B obliquely extends toward one side of horizontal portion 50A in the longitudinal direction and toward the lower side (insulating substrate 12 side). A tip part of the conductor connection portion 50B is bent so as to be substantially parallel to the insulating substrate 12, and is disposed on the second conductor portion 16. The tip part of the conductor connection portion 50B is bonded to the second conductor portion 16 with a solder BM (see FIG. 14), which is a conductive bonding material. From the other end part of the horizontal portion 50A in the longitudinal direction of the horizontal portion 50A, a gate connection portion 50C obliquely extends toward the other side of the horizontal portion 50A in the longitudinal direction and toward the lower side (insulating substrate 12 side). The gate connection portion 50C is formed to have a smaller width than the horizontal portion 50A and the conductor connection portion 50B. A tip part of the gate connection portion 50C is bent in an arc shape toward the upper side, and is disposed on the gate electrode 24. The tip part of the gate connection portion 50C is bonded to the gate electrode 24 by solder BM (see FIG. 14), which is a conductive bonding material.

Figure 2:
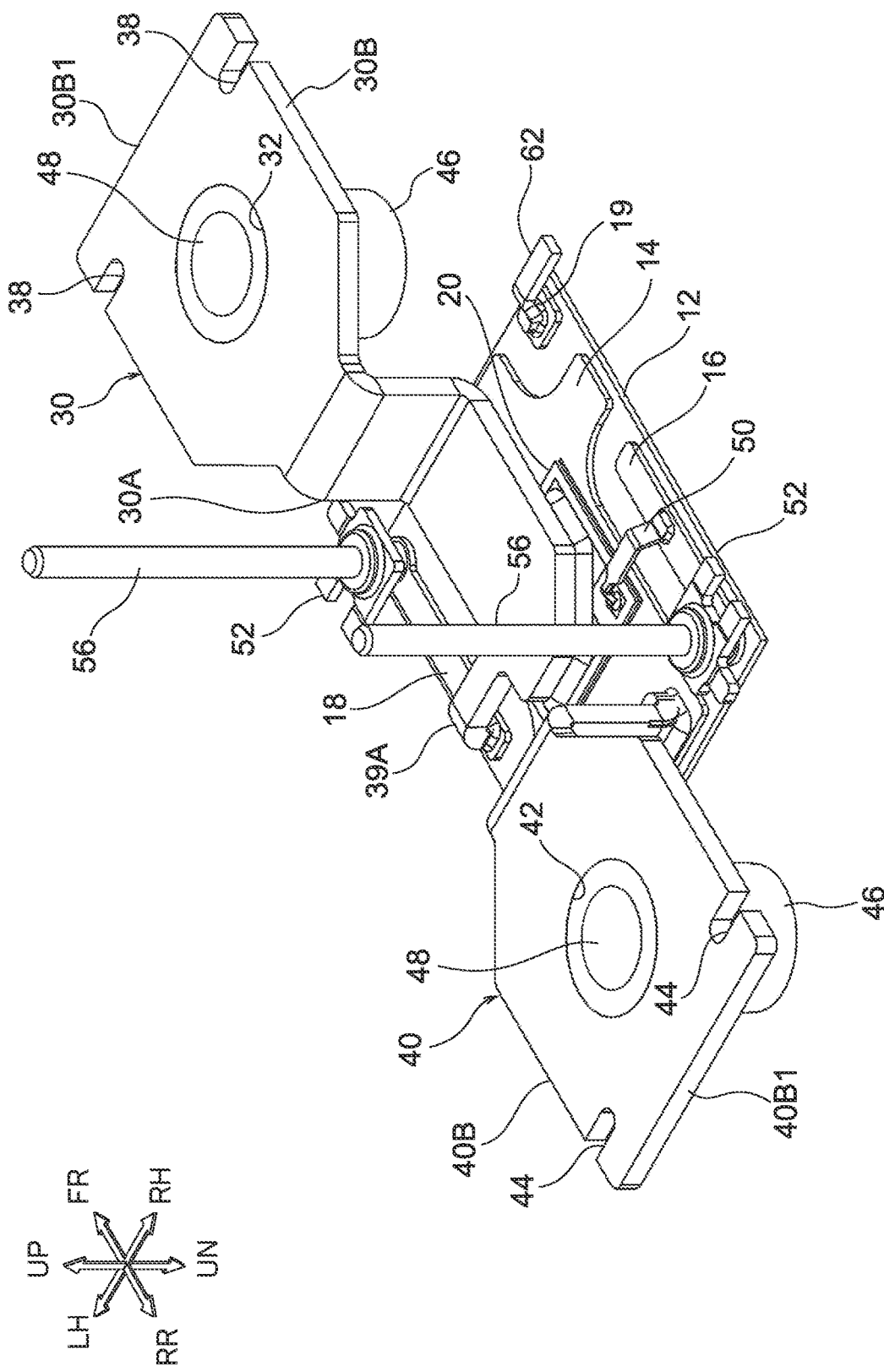
FIG. 2 is a perspective view illustrating a state in which illustration of a sealing resin is omitted in the semiconductor device according to the embodiment.
Figure 3:
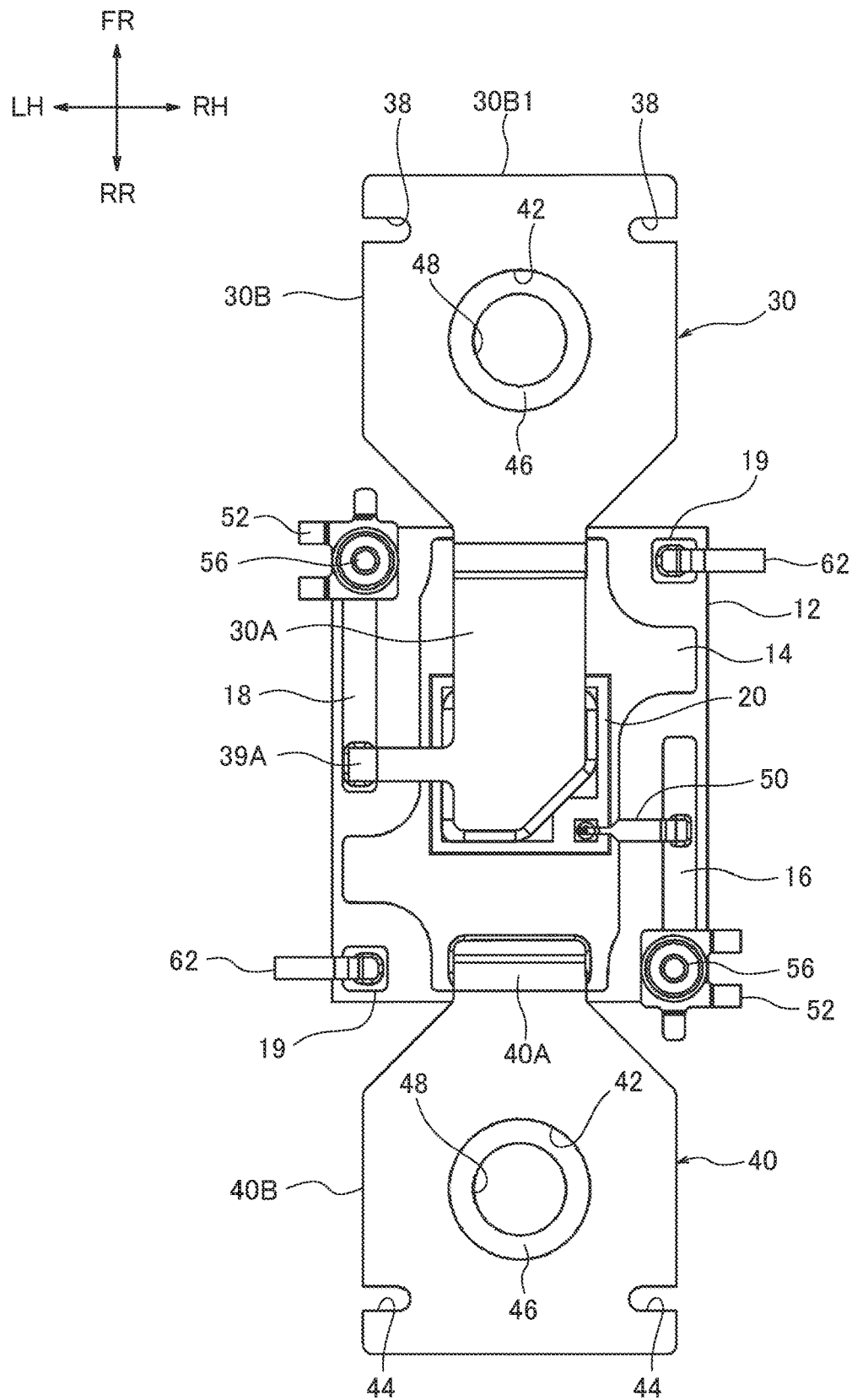
FIG. 3 is a plan view illustrating a state in which illustration of a sealing resin is omitted in the semiconductor device according to the embodiment.

As illustrated in FIGS. 2 to 4, a support member 52 having a flat plate shape is disposed above each of the left side of a front end part and the right side of a rear end part of the insulating substrate 12. One support member 52 is disposed at a predetermined distance above the second conductor portion 16, and the other support member 52 is disposed at a predetermined distance above the third conductor portion 18. The support members 52 are manufactured by press-molding a conductive flat plate material (copper plate in this case), and are formed in a substantially rectangular flat plate shape. The support members 52 are disposed parallel to the insulating substrate 12. The flat plate material constituting the support members 52 is set to have a plate thickness thinner than that of the flat plate material constituting the first terminal 30 and the second terminal 40, and is set to have a plate thickness thicker than that of the flat plate material constituting the connection member 50.

Figure 15:
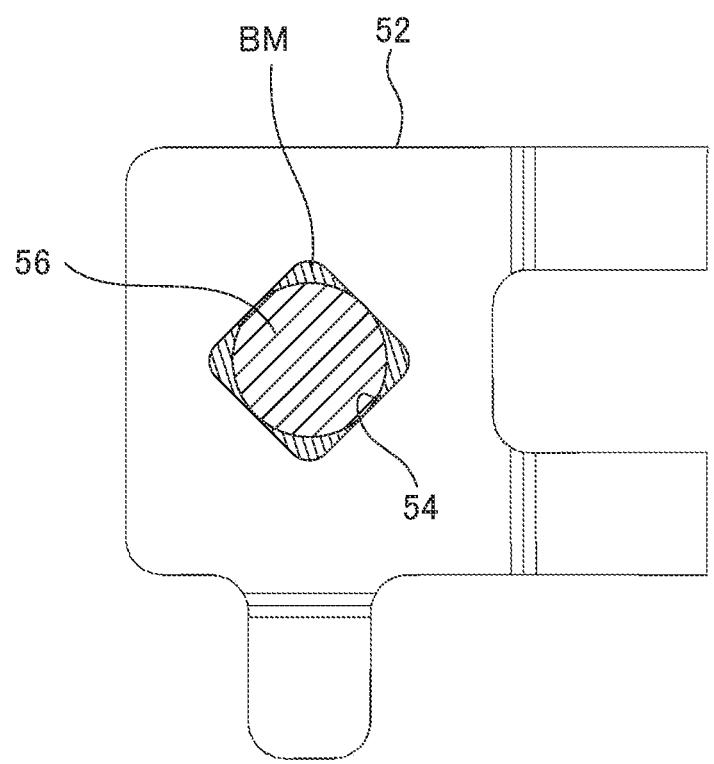
FIG. 15 is a plan view illustrating a state in which a pin terminal is press-fitted in a through-hole of a support member.
Figure 16:
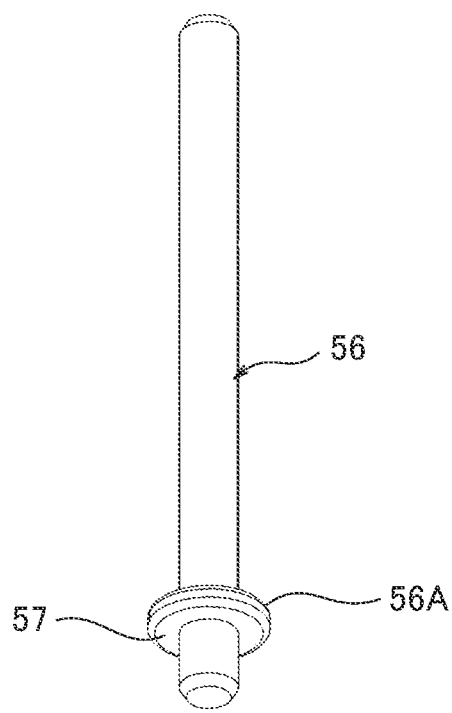
FIG. 16 is a perspective view illustrating the pin terminal.

As illustrated in FIG. 15, in a central part of each of the support members 52, there is formed a through-hole 54 having a polygonal shape (substantially quadrangular shape in this case). The inner peripheral surfaces of the four corner parts (four corners) of the through-hole 54 are formed to have a curved surface shape, and have an arc shape as viewed in the vertical direction that is the penetration direction of the through-hole 54. In each through-hole 54, the pin terminal 56 is inserted through (press-fitted in this case) and supported. As illustrated in FIG. 16, the pin terminal 56 is formed of a conductive material (metal in this example) into a long rod shape (columnar shape in this case). The shape of the through-hole 54 of the support member 52 is not limited to the above, and can be changed as appropriate. Specifically, the through-hole 54 only has to have a polygonal shape such as a triangular shape, a pentagonal shape, or a hexagonal shape. In the embodiment, the inner peripheral surfaces of the four corner parts of the through-hole 54 are formed in a curved surface shape so that it is possible to reduce stress concentration on the four corner parts due to press-fitting of the pin terminal 56. However, the inner peripheral surfaces of the corner parts of the through-hole 54 may be configured not to be formed in a curved surface shape.

On one end side (lower end part side) of the pin terminal 56 in the longitudinal direction of the pin terminal 56, a brim-shaped flange portion 56A is formed. One end portion of the pin terminal 56 in the longitudinal direction of the pin terminal 56 is inserted (press-fitted here) into the through-hole 54 of the support member 52 from the upper side, in other words, from the opposite side with respect to the second conductor portion 16 or the third conductor portion 18 of the insulating substrate 12. Therefore, four locations of the outer peripheral surface on the lower end part side of the pin terminal 56 are in linear contact with the inner peripheral surface of the through-hole 54. The lower surface of the flange portion 56A of the pin terminal 56 is a facing surface 57 facing an edge portion of the through-hole 54 from the upper side, and is bonded to the upper surface of the support member 52 via a solder BM, which is a conductive bonding material. The term "facing" includes a case where the flange portion 56A is connected to the edge portion of the through-hole 54 via the solder BM, in addition to the case where the flange portion 56A is in contact with an edge portion of the through-hole 54.

As shown in FIG. 15, a space between the outer periphery of the pin terminal 56 and the inner periphery of the through-hole 54 is filled with the solder BM (not shown in FIG. 4). To give more details about the term "filled", in the embodiment, after the pin terminal 56 is press-fitted into the through-hole 54 of the support member 52, the support member 52 and the pin terminal 56 are heated, and a layer of the solder BM provided on the upper surface of the support member 52 is melted. The molten solder BM wetly spreads between the upper surface of the support member 52 and the facing surface 57 of the flange portion 56A, and is poured between the outer periphery of the pin terminal 56 and the inner periphery of the through-hole 54 by the flange portion 56A. After that, the molten solder BM solidifies. This enlarges the contact area between the pin terminal 56 and the support member 52 via the solder BM.

Figure 17:
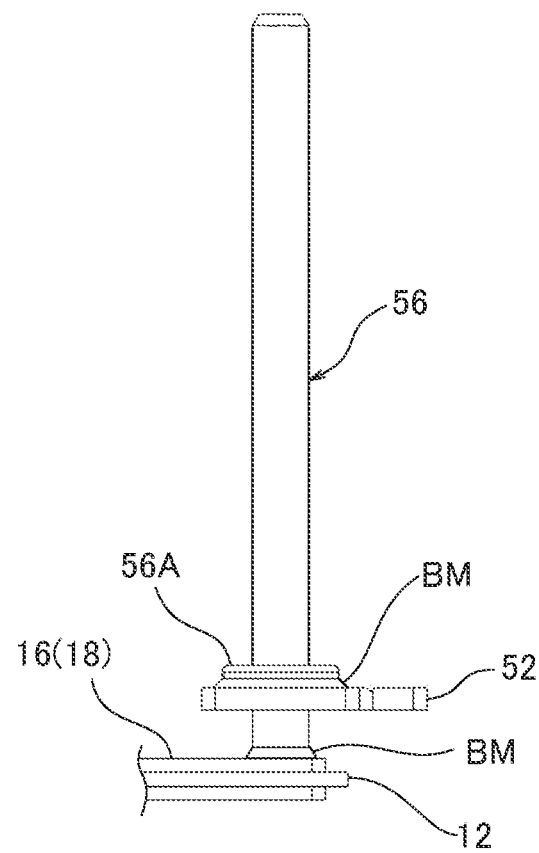
FIG. 17 is a side view illustrating the pin terminal, the support member, and part of the insulating substrate.

As illustrated in FIG. 17, the lower end of the pin terminal 56 is in contact with the upper surface of the second conductor portion 16 or the third conductor portion 18 of the insulating substrate 12, and is bonded to the second conductor portion 16 or the third conductor portion 18 with the solder BM. As a result, the pin terminal 56 is electrically connected to the second conductor portion 16 or the third conductor portion 18. The pin terminal 56 connected to the second conductor portion 16 is used to input a control signal to the gate electrode 24. The pin terminal 56 connected to the third conductor portion 18 is for grounding so that the source electrode 22 is configured to be grounded via the first terminal 30, the third conductor portion 18, and the pin terminal 56.

In the semiconductor device 10 having the configuration described above, as illustrated in FIG. 1, the sealing resin 60 seals the insulating substrate 12, the first conductor portion 14, the second conductor portion 16, the third conductor portion 18, the semiconductor element 20, the connection member 50, the support members 52, and the lower end part sides (base end side) of the pin terminals 56. The outer terminal portions 30B and 40B of the first terminal 30 and the second terminal 40 are provided on the upper surface of the sealing resin 60 and exposed to the outside of the sealing resin 60. The upper end side of the pin terminal 56 (the other end side in the longitudinal direction, in other words, the tip part side) protrudes to the outside of the sealing resin 60.

As illustrated in FIGS. 2 to 5, other than the first to third conductor portions 14, 16, and 18, two suspension member bonding portions 19 made of a conductor pattern (copper pattern) are provided on the insulating substrate 12. The two suspension member bonding portions 19 are each formed on one of the right side of the front end part side or the left side of the rear end part of the insulating substrate 12. To each of the suspension member bonding portions 19, a suspension pin 62, which is a suspension member, is bonded by using a conductive bonding material. The suspension pins 62 are configured with a plate material having the same thickness as the support members 52, and have an elongated shape whose longitudinal direction is in the left-right direction.

Figure 18:
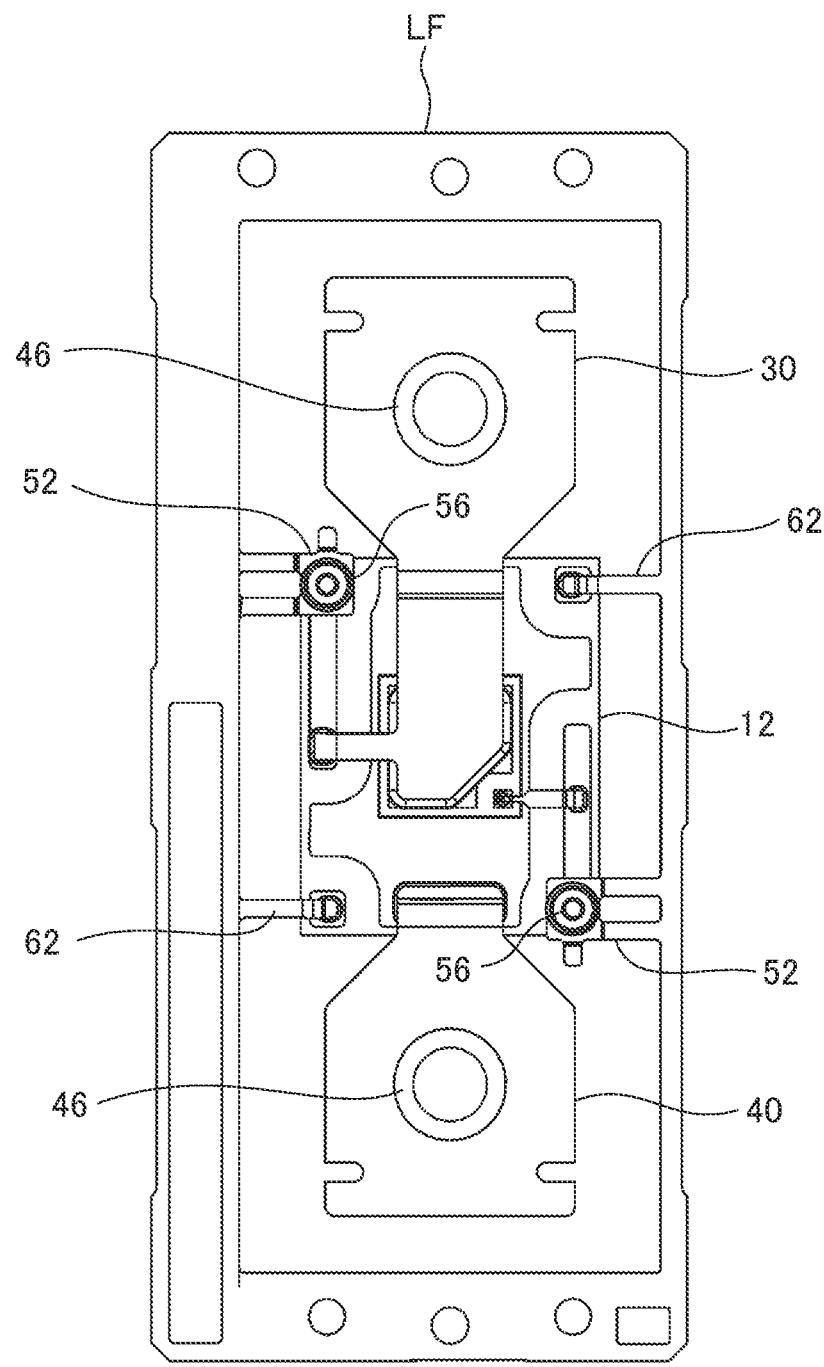
FIG. 18 is a first plan view illustrating the semiconductor device according to the embodiment in a state in the middle of manufacturing.
Figure 19:
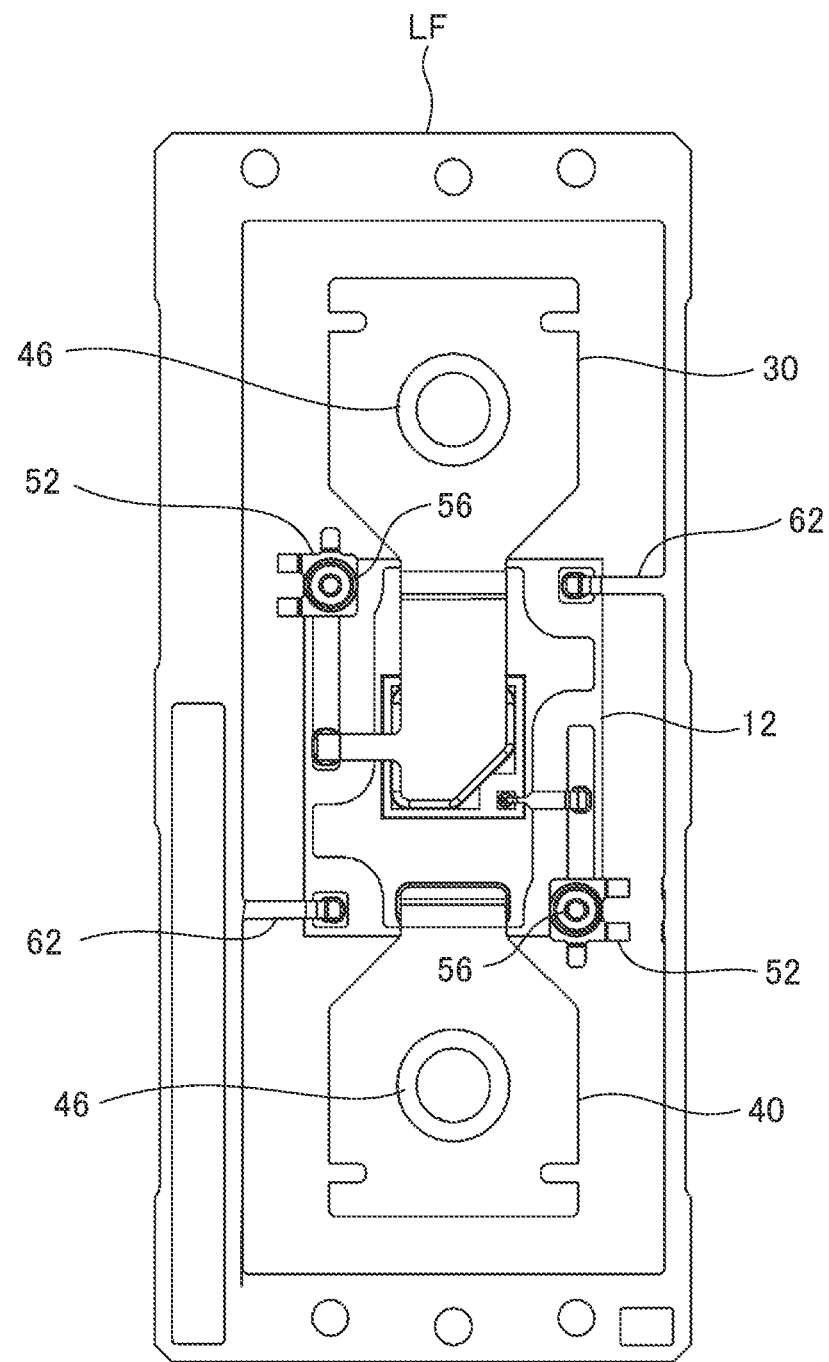
FIG. 19 is a second plan view illustrating the semiconductor device according to the embodiment in a state in the middle of manufacturing.
Figure 20:
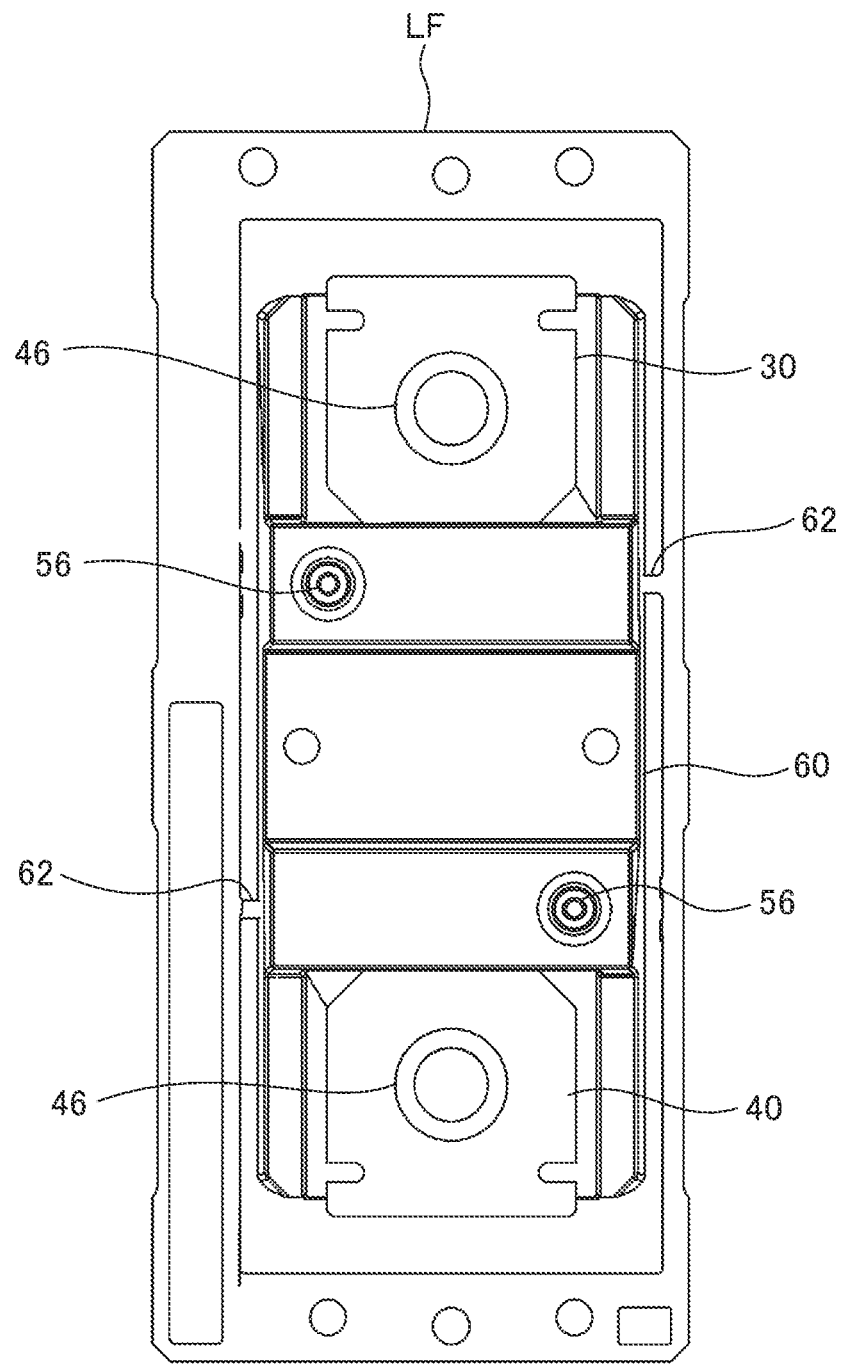
FIG. 20 is a third plan view illustrating the semiconductor device according to the embodiment in a state in the middle of manufacturing.

The suspension pins 62 and the support members 52 are constituted by parts of a lead frame LF illustrated in FIGS. 18 and 19. Specifically, at the time of manufacturing the semiconductor device 10, as illustrated in FIG. 18, the insulating substrate 12 to which the first terminal 30, the second terminal 40, the connection member 50, and the pin terminals 56 are bonded is supported by the lead frame LF via the pin terminals 56. In the state illustrated in FIG. 18, the two support members 52 and the two suspension pins 62 are each connected to the lead frame LF. The insulating substrate 12 is conveyed to the next step in this state. In the next step, as illustrated in FIG. 19, the two support members 52 are cut off from the lead frame LF, but the two suspension pins 62 are kept connected to the lead frame LF. The insulating substrate 12 is conveyed to the next step in this state. In the next step, as shown in FIG. 20, the sealing resin 60 is formed. After the sealing resin 60 is molded, the two suspension pins 62 are cut off from the lead frame LF to complete the semiconductor device 10 illustrated in FIG. 1. In the semiconductor device 10 manufactured in this manner, the end surfaces of the suspension pins 62 are exposed to the outside of the sealing resin 60 (see FIG. 1).

Next, actions and effects of the embodiment will be described. In the semiconductor device 10 having the configuration described above, the first conductor portion 14 and the second conductor portion 16 are formed on the insulating substrate 12, and the semiconductor element 20 is disposed on the first conductor portion 14. The drain electrode of the semiconductor element 20 is connected to the first conductor portion 14. To the source electrode 22 of the semiconductor element 20, the first terminal 30 having a flat plate shape is connected, and to the first conductor portion 14, the second terminal 40 having a flat plate shape is connected. The gate electrode 24 of the semiconductor element 20 and the second conductor portion 16 are electrically connected by the connection member 50. The support member 52 having a flat plate shape is disposed at a predetermined distance from the second conductor portion 16, and the pin terminal 56 having a rod shape connected to the second conductor portion 16 is supported in the state of being inserted through the support member 52. The insulating substrate 12, the first conductor portion 14, the second conductor portion 16, the semiconductor element 20, the connection member 50, and the support members 52 are sealed with the sealing resin 60.

The first terminal 30 and the second terminal 40 are separately provided from the support members 52 supporting the pin terminals 56. This makes it possible to manufacture the first terminal 30, the second terminal 40, and the support members 52 from the flat plate materials having different plate thicknesses. Therefore, even in a case where the plate thicknesses of the first terminal 30 and the second terminal 40 are made thick to deal with a large current, the plate thickness of the support members 52 can be made thin, whereby it is possible to prevent an increase in the size of the overall configuration of the semiconductor device 10 and to downsize the semiconductor device 10. Since it is not necessary to increase the plate thickness of the lead frame LF, which is the material for the support members 52, it is possible to avoid that fine processing on the lead frame LF becomes more difficult as the plate thickness increases. As a result, for example, since the through-holes 54 of the support members 52 can be formed with high accuracy, the pin terminals 56 can be accurately press-fitted into the through-holes 54 and be supported.

The first terminal 30 and the second terminal 40 respectively include the inner terminal portions 30A and 40A disposed inside the sealing resin 60 and the outer terminal portions 30B and 40B disposed in the state of being exposed to the outside of the sealing resin 60. Since on each of the outer terminal portions 30B and 40B of the first terminal 30 and the second terminal 40 there is provided with the female thread portion 48, connection by screw clamping to the first terminal 30 and the second terminal 40 is possible. Since it is not necessary to embed nuts for screw clamping in the sealing resin 60, the semiconductor device 10 can be made thinner. As a result, for example, it is possible to improve heat dissipation performance of the semiconductor device 10. In addition, for example, as compared with a configuration in which the first terminal and the second terminal are extended and the extended portions are used to hold nuts for screw clamping in the sealing resin 60, a wiring resistance is smaller, and inductance can be accordingly lower.

The outer terminal portions 30B and 40B respectively have insertion holes 36 and 42 penetrating in the plate thickness direction of the outer terminal portions 30B and 40B, and the female thread portion 48 is formed in a female threaded member 46 inserted in and fixed to each of the insertion holes 36 and 42 of the outer terminal portions 30B and 40B. This configuration can increase strength of the female thread portions 48 as compared with, for example, the following configuration. The outer terminal portions 30B and 40B are subjected to burring to form cylindrical rising portions, and the female thread portion 48 is formed in the inner periphery of each of the rising portions.

One end portions of the female threaded members 46 are inserted into the insertion holes 36 and 42, and the other end portion sides are sealed in the sealing resin 60. In this configuration, the female threaded members 46 are fixed with respect to the sealing resin 60, and the strength against a load applied to the first terminal 30 and the second terminal 40 at the time of screw clamping is therefore increased.

On both the left and right sides on the front end part side of the outer terminal portion 30B and on both the left and right sides on the rear end part side of the outer terminal portion 40B, there are respectively formed cutout portions 38 and 44 whose outer sides in the left-right direction are opened. The sealing resin 60 fills the cutout portions 38 and 44. This configuration further increases the strength against a load applied when screw clamping is performed with respect to the first terminal 30 and the second terminal 40.

The first terminal 30 includes the bent portion 39A bent toward the third conductor portion 18 and the tip connection portion 39B provided at a tip part of the bent portion 39A. The tip connection portion 39B is connected to the third conductor portion 18 with the solder BM. Since the shape of the tip connection portion 39B is formed when a flat plate material for constituting the first terminal 30 is punched by press working, the shape of the tip connection portion 39B can be made stable regardless of the plate thickness of the flat plate material and the bending radius of the bent portion 39A. As a result, the strength of bonding the tip connection portion 39B to the third conductor portion 18 via the solder BM can be made stable.

The tip connection portion 39B is formed in a curved surface shape and is in linear contact with the third conductor portion 18. This configuration enables the fillet of the solder BM to be easily formed stably. In addition, it is easy to secure the thickness of the solder in the outermost peripheral part of the tip connection portion 39B where the stress due to thermal shrinkage of the solder BM tends to concentrate, whereby the stress can be relaxed. In addition, since the tip connection portion 39B provided at the tip part of the bent portion 39A is bonded to the third conductor portion 18 as described above, the area required for bonding can be made constant regardless of the plate thickness of the flat plate material and the bending radius of the bent portion 39A. As a result, the occupied area of the first terminal 30 can be prevented from increasing, and an increase in the size of the product can be avoided.

In the grounding extension portion 39 of the first terminal 30, the portion on the tip side with respect to the bent portion 39A may be bent so as to be parallel to the insulating substrate 12, and the bend portion may be connected to the third conductor portion 18 (connection target portion). However, in such a configuration, when the plate thickness of the first terminal 30 (terminal member) is increased, the bending radius of the bend portion increases. As a result, there arises a problem that it becomes difficult to form the bending radius of the bend portion to be constant and that it therefore becomes difficult for a solder fillet to be stably formed. In addition, there is an increase in the occupied area required for bonding the bend portion to the connection target portion as described above, and therefore, there also arises a problem that there will be an increase in the size of the overall configuration of the semiconductor device 10. In this regard, the present embodiment can solve the problem as described above.

A location LC (see FIG. 12) that is on the tip connection portion 39B and is in linear contact with the third conductor portion 18 extends in a direction orthogonal to the curvature center line CC that is the bending center of the bent portion 39A. Owing to such a configuration, the bent portion 39A may be bent by bending work after a flat plate material for constituting the first terminal 30 is punched, by press working, to form the tip connection portion 39B. Therefore, the tip connection portion 39B and the bent portion 39A can be formed with a small number of processes. This can lower the manufacturing cost of the first terminal 30, for example.

According to the embodiment, the semiconductor element 20 is disposed on the first conductor portion 14 on the insulating substrate 12, and the support members 52 having a flat plate shape are each disposed at a predetermined distance from one of the second conductor portion 16 or the third conductor portion 18 on the insulating substrate 12. On each of the support members 52, the columnar pin terminal 56 is supported in a state of being inserted through the support member 52, and the pin terminals 56 are each connected to one of the second conductor portion 16 or the third conductor portion 18. Each of the support members 52 has the through-hole 54 penetrating in the plate thickness direction of the support member 52, and the pin terminal 56 is inserted through the through-hole 54. The through-hole 54 has a polygonal shape, and the contact area between the pin terminal 56 and the through-hole 54 is therefore smaller as compared with a case in which the through-hole 54 is a round hole. Therefore, the pin terminal 56 can be inserted into the through-hole 54 with stable accuracy as compared with the case where the through-hole 54 is a round hole.

A space between each pin terminal 56 and its corresponding through-hole 54 is filled with the solder BM with which the pin terminal 56 and its corresponding support member 52 are bonded to each other. As a result, the contact area, via the solder BM, between each pin terminal 56 and its corresponding support member 52 is enlarged. Therefore, the electrical resistance between each pin terminal 56 and its corresponding support member 52 is reduced. The pin terminal 56 has the facing surface 57 (see FIG. 16) that faces the edge portion of the through-hole 54 from the opposite side with respect to the second conductor portion 16 or the third conductor portion 18, and the facing surface 57 is bonded to the edge portion of the through-hole 54 with the solder BM. This configuration also enlarges the contact area, via the solder BM, between each pin terminal 56 and its corresponding support member 52. Therefore, the electrical resistance between each pin terminal 56 and its corresponding support member 52 is further reduced. The inner peripheral surfaces of the four corner parts of the through-hole 54 are formed in a curved surface shape. This configuration makes it possible to reduce stress concentration on the four corner parts described above due to press-fitting of the pin terminal 56 into the through-hole 54.

<Various Modifications>

Figure 21:
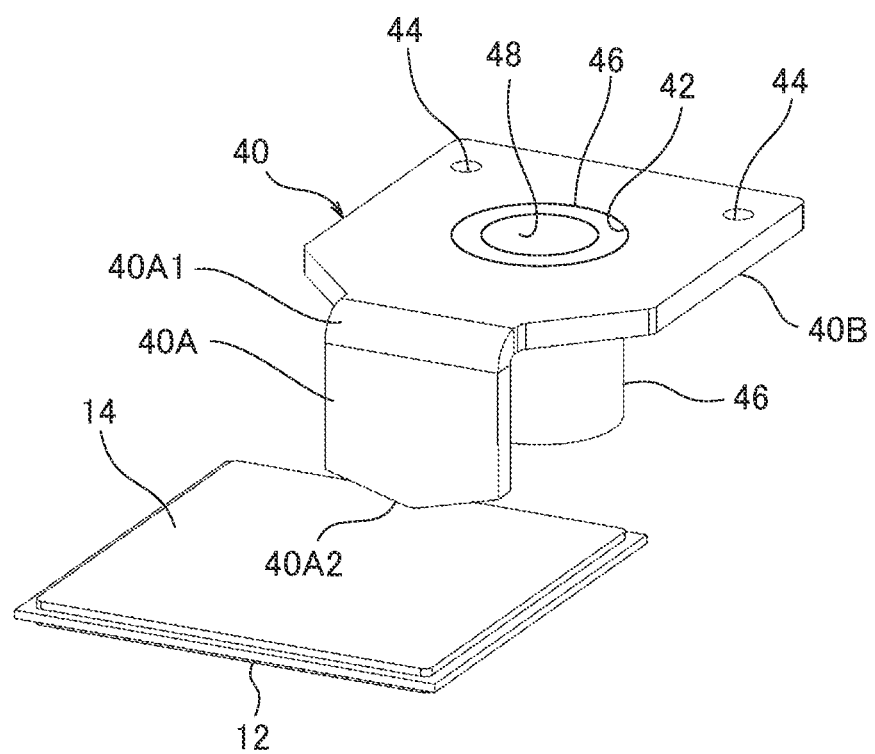
FIG. 21 is a perspective view illustrating a first modification of the second terminal.

Next, various modifications of the embodiment described above will be described with reference to FIGS. 21 to 30. FIG. 21 illustrates a first modification of the second terminal 40 in a perspective view. The first modification of the second terminal 40 corresponds to a "terminal member". In the first modification of the second terminal 40, the inner terminal portion 40A has: a bent portion 40A1 bent toward the first conductor portion 14 (connection target portion) of the insulating substrate 12; and a tip connection portion 40A2 provided at a tip part (lower end part) of the bent portion 40A1. The lower end of the tip connection portion 40A2 has a substantially V-shape. The lower end of the tip connection portion 40A2 is in linear contact with the first conductor portion 14. When the tip connection portion 40A2 and the first conductor portion 14 are bonded together with solder, a solder fillet is easily formed stably.

Figure 22:
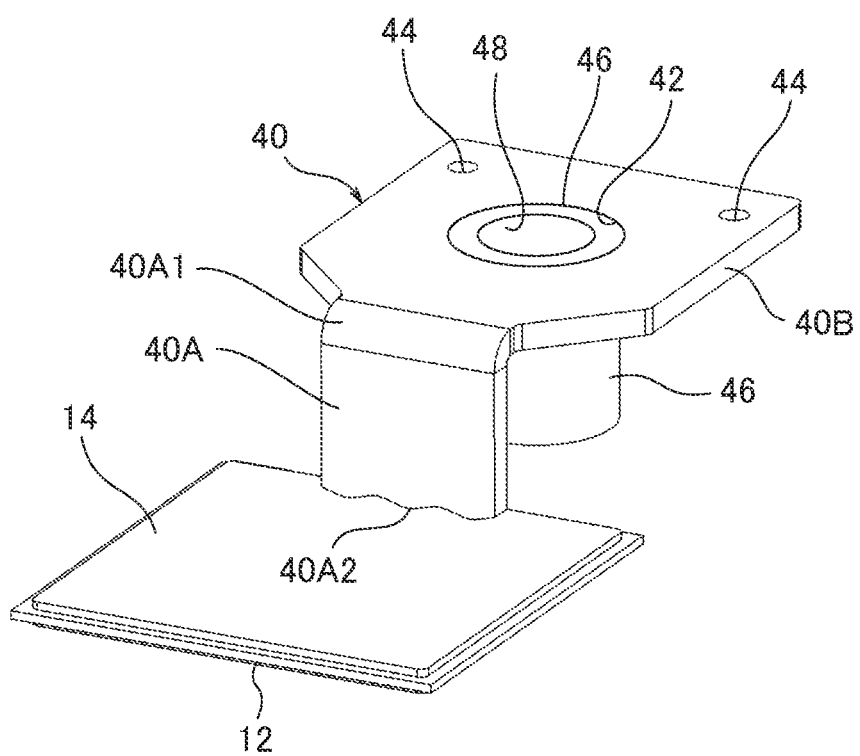
FIG. 22 is a perspective view illustrating a second modification of the second terminal.

FIG. 22 illustrates a second modification of the second terminal 40 in a perspective view. The second modification of the second terminal 40 corresponds to a "terminal member", and has: a bent portion 40A1; and a tip connection portion 40A2, similarly to the first modification of the second terminal 40. The lower end of the tip connection portion 40A2 has a wave shape and is in linear contact with the first conductor portion 14 on the insulating substrate 12 at a plurality of locations. When the tip connection portion 40A2 and the first conductor portion 14 are bonded together with solder, a solder fillet is easily formed stably.

Figure 23:
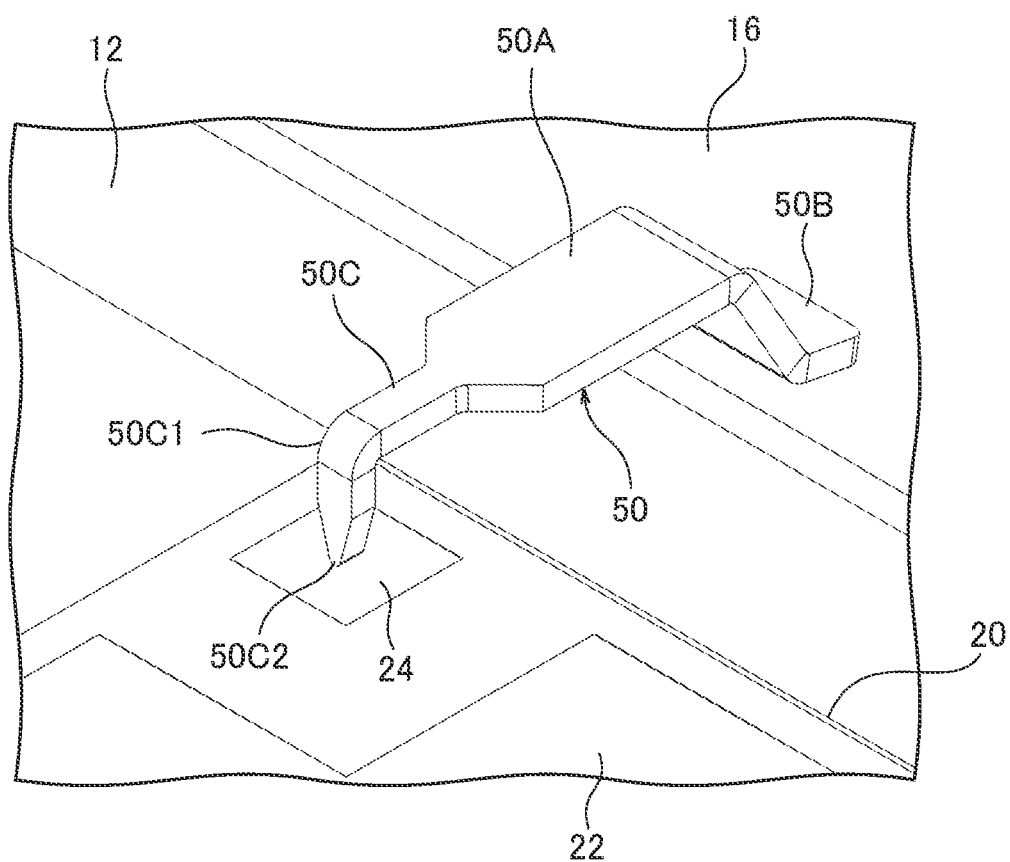
FIG. 23 is a perspective view illustrating a first modification of the connection member.

FIG. 23 illustrates a first modification of the connection member 50 in a perspective view. The first modification of the connection member 50 corresponds to a "terminal member". In the first modification of the connection member 50, the gate connection portion 50C has: a bent portion 50C1 bent toward the gate electrode 24 (connection target portion) of the semiconductor element 20; and a tip connection portion 50C2 provided at a tip part (lower end part) of the bent portion 50C1. The lower end of the tip connection portion 50C2 has a substantially V-shape and is in linear contact with the gate electrode 24. When the tip connection portion 50C2 and the gate electrode 24 are bonded together with solder, a solder fillet is easily formed stably.

Figure 24:
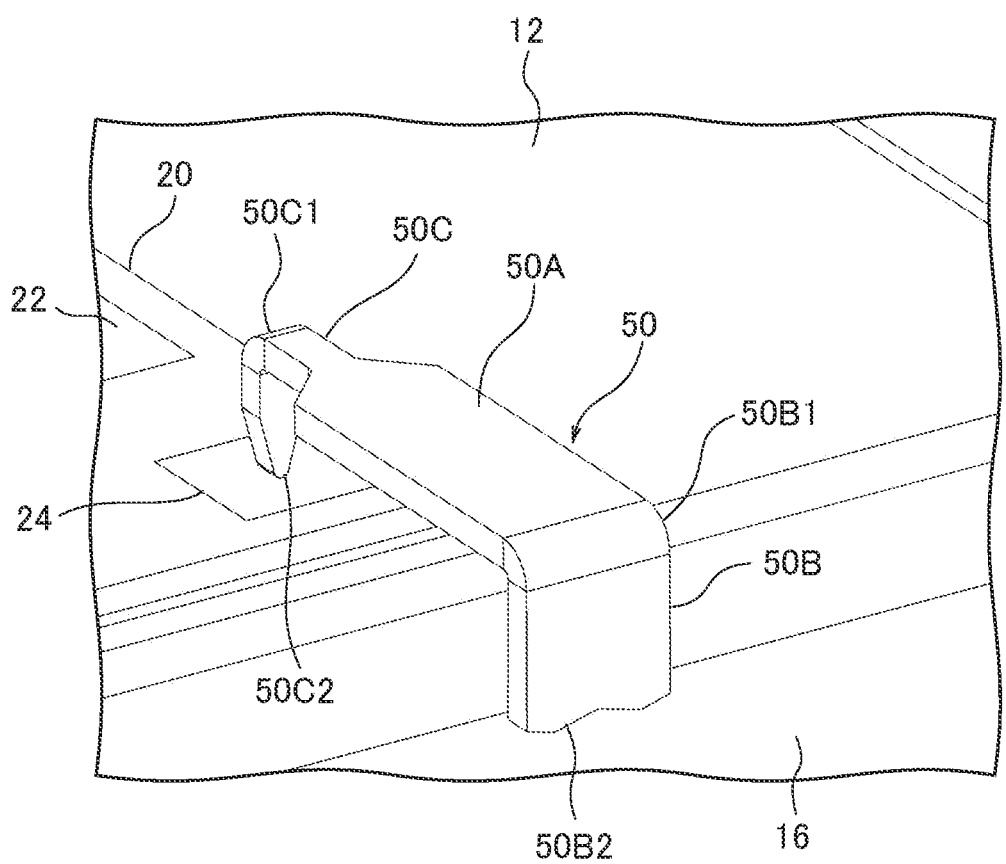
FIG. 24 is a perspective view illustrating a second modification of the connection member.

FIG. 24 illustrates a second modification of the connection member 50 in a perspective view. The second modification of the connection member 50 corresponds to a "terminal member", and has: a bent portion 50C1; and a tip connection portion 50C2, similarly to the first modification of the connection member 50. In the second modification of the connection member 50, the conductor connection portion 50B has: a bent portion 50B1 bent toward the second conductor portion 16 of the insulating substrate 12; and a tip connection portion 50B2 provided at a tip part (lower end part) of the bent portion 50B1. The lower end of the tip connection portion 50B2 has a wave shape and is in linear contact with the second conductor portion 16 at a plurality of locations. When the tip connection portion 50B2 and the second conductor portion 16 are bonded together with solder, a solder fillet is easily formed stably.

Figure 25:
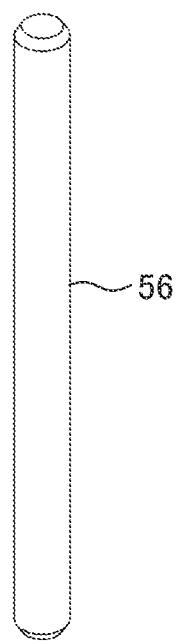
FIG. 25 is a perspective view illustrating a first modification of the pin terminal.
Figure 26:
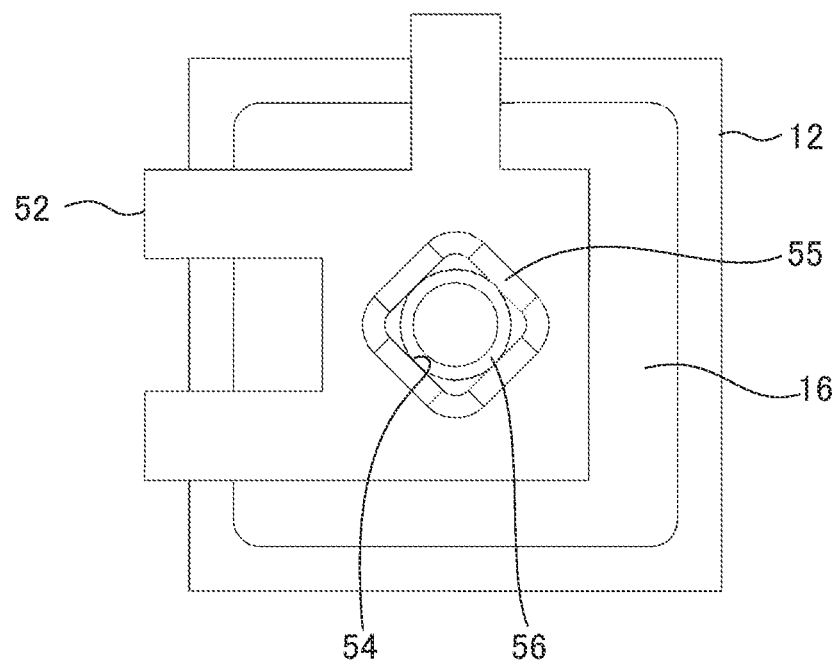
FIG. 26 is a plan view illustrating a state in which the pin terminal is inserted through the support member in the first modification of the pin terminal.

FIG. 25 illustrates a first modification of the pin terminal 56 in a perspective view. The first modification of the pin terminal 56 does not have the flange portion 56A. In the support member 52 through which the first modification of the pin terminal 56 is inserted, chamfered portions 55 are formed on the upper surface side of an edge portion of the through-hole 54, as illustrated in FIG. 26. After the pin terminal 56 is press-fitted into the through-hole 54 of the support member 52, the support member 52 and the pin terminal 56 are heated, and a layer of solder provided on the upper surface of the support member 52 is melted. Being guided by the chamfered portions 55, the molten solder is guided and flows in between the outer periphery of the pin terminal 56 and the inner periphery of the through-hole 54, and then solidifies. This enlarges the contact area between the pin terminal 56 and the support member 52 via the solder BM.

Figure 27:
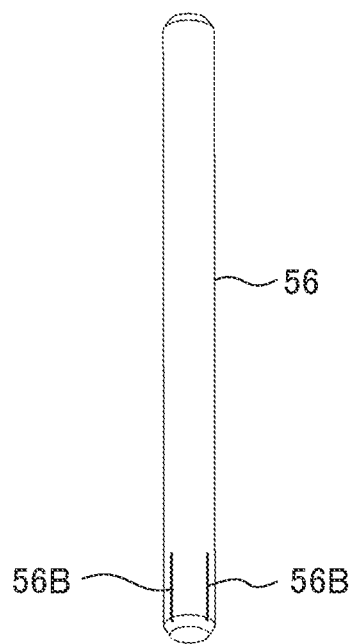
FIG. 27 is a perspective view illustrating a second modification of the pin terminal.
Figure 28:
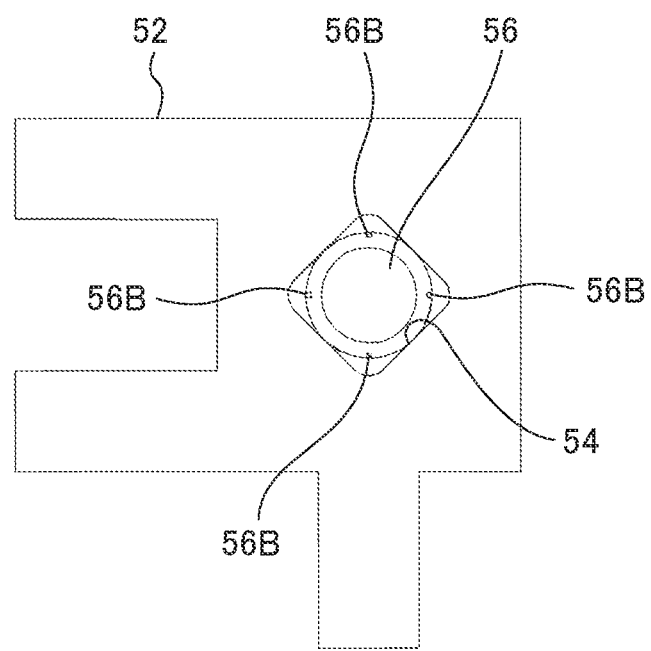
FIG. 28 is a plan view illustrating a state in which the pin terminal is inserted through the support member in the second modification of the pin terminal.

FIG. 27 illustrates a second modification of the pin terminal 56 in a perspective view. The second modification of the pin terminal 56 does not have the flange portion 56A similarly to the first modification of the pin terminal 56, but includes a plurality of (four in this case) groove portions 56B in the outer periphery of the lower end part. The four groove portions 56B extend in the axial direction (vertical direction) of the pin terminal 56. The pin terminal 56 is press-fitted into the through-hole 54, as illustrated in FIG. 28, such that the four groove portions 56B face the four corner parts of the through-hole 54 of the support member 52. After the pin terminal 56 is press-fitted into the through-hole 54 of the support member 52, the support member 52 and the pin terminal 56 are heated, and a layer of solder provided on the upper surface of the support member 52 is melted. The molten solder is guided by the plurality of groove portions 56B and flows in between the outer periphery of the pin terminal 56 and the inner periphery of the through-hole 54. Then, the molten solder solidifies. In addition, the solder on the conductor portion on the insulating substrate 12 is sucked up by the capillary phenomenon in the plurality of groove portions 56B, flows in between the outer periphery of the pin terminal 56 and the inner periphery of the through-hole 54, and then solidifies. This enlarges the contact area between the pin terminal 56 and the support member 52 via the solder BM.

Figure 29:
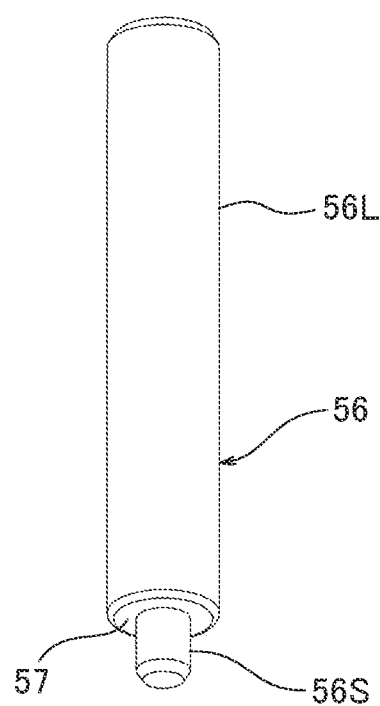
FIG. 29 is a perspective view illustrating a third modification of the pin terminal.
Figure 30:
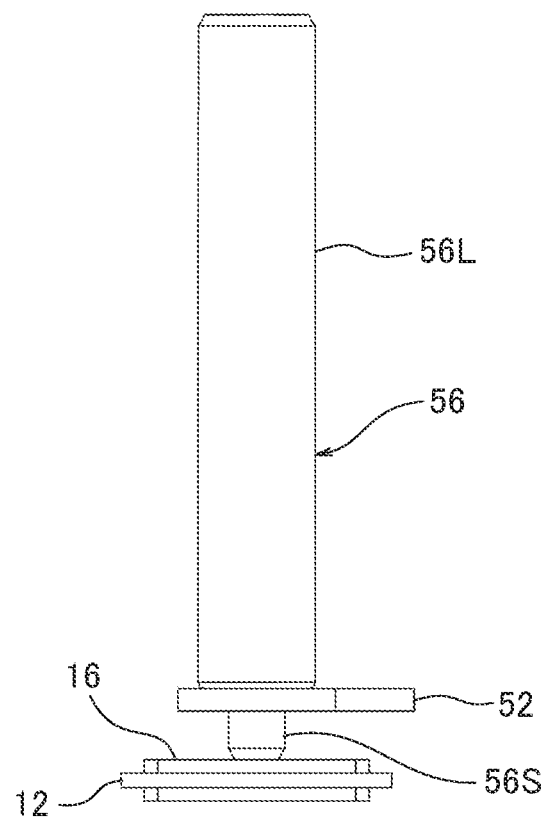
FIG. 30 is a side view illustrating a state in which the pin terminal is inserted through the support member in the third modification of the pin terminal.

FIG. 29 illustrates a third modification of the pin terminal 56 in a perspective view. In the third modification of the pin terminal 56, the portion other than the lower end part is made to be a large diameter portion 56L, and the lower end part is made to be a small diameter portion 56S. The small diameter portion 56S is formed to have a smaller diameter than the large diameter portion 56L, and is press-fitted into the through-hole 54 of the support member 52 (see FIG. 30). A facing surface 57 facing downward is formed between the small diameter portion 56S and the large diameter portion 56L, and the facing surface 57 faces the edge portion of the through-hole 54 from the upper side. When the layer of solder BM provided on the upper surface of the support member 52 is melted with the pin terminal 56 and the support member 52 being heated, the molten solder BM wetly spreads between the upper surface of the support member 52 and the facing surface 57, and the facing surface 57 pours the molten solder BM between the outer periphery of the pin terminal 56 and the inner periphery of the through-hole 54. After that, the molten solder BM solidifies. This enlarges the contact area between the pin terminal 56 and the support member 52 via the solder BM.

In the embodiment, the description has been given on the case where the semiconductor element 20 is a power MOSFET, but the semiconductor element 20 is not limited to a power MOSFET. The semiconductor element may be another element such as an insulated gate bipolar transistor (IGBT), a thyristor, or a diode. As a material of the semiconductor element, it is possible to use a material such as silicon, SiC, or GaN.

The semiconductor element 20 in the embodiment is a so-called vertical semiconductor element having the source electrode 22 on one surface and the drain electrode on the other surface, but the semiconductor element 20 is not limited thereto. The semiconductor element may be a so-called horizontal semiconductor element that has a source electrode and a drain electrode on a surface on one side.

What is claimed is:

1. A terminal member connected to a connection target portion, the terminal member and formed of plate material, comprising:
    a bent portion bent toward the connection target portion; and
    a tip connection portion provided at a tip part of the bent portion and being a cross section formed by being punched out in a press processing in a direction of a plate thickness,
    wherein the tip connection portion is connected to the connection target portion via a conductive bonding material;
    wherein the tip connection portion is formed in a curved surface shape and is in linear contact with the connection target portion, and
    wherein the bent portion is bent with a curvature center line as a bending center, and a location that is in linear contact with a conductor portion on the tip connection portion extends in a direction orthogonal to the curvature center line.

2. A semiconductor device, comprising:
an insulating substrate;
a semiconductor element disposed on a conductor portion formed on the insulating substrate;
the terminal member according to claim 1, in which the tip connection portion is
connected to the conductor portion, which serves as the connection target portion; and
a sealing resin that seals the insulating substrate and the semiconductor element.

3. The semiconductor device of claim 2, wherein the tip connection portion of the terminal member is formed in a curved surface shape and is in linear contact with the conductor portion.

4. The semiconductor device of claim 2, wherein the bend portion of the terminal member is bent with the curvature center line as the bending center, and the location that is in linear contact with the conductor portion on the tip connection portion extends in the direction orthogonal to the curvature center line.

\* \* \* \* \*